US012635384B2

(12) United States Patent
Song et al.

(10) Patent No.: US 12,635,384 B2
(45) Date of Patent: May 19, 2026

(54) DISPLAY DEVICE

(71) Applicant: SAMSUNG DISPLAY CO., LTD.,
Yongin-si (KR)

(72) Inventors: Bo Kwang Song, Yongin-si (KR); Gee Bum Kim, Yongin-si (KR); Kwang Soo Bae, Yongin-si (KR); Dae Young Lee, Yongin-si (KR); Min Oh Choi, Yongin-si (KR)

(73) Assignee: SAMSUNG DISPLAY CO., LTD.,
Yongin-si (KR)

( * ) Notice: Subject to any disclaimer, the term of this patent is extended or adjusted under 35 U.S.C. 154(b) by 541 days.

(21) Appl. No.: 18/096,802

(22) Filed: Jan. 13, 2023

(65) Prior Publication Data

US 2023/0320169 A1 Oct. 5, 2023

(30) Foreign Application Priority Data

Apr. 1, 2022 (KR) ........................ 10-2022-0041135

(51) Int. Cl.
*H10K 59/65* (2023.01)
*G06V 40/13* (2022.01)
*H10K 59/122* (2023.01)
*H10K 59/35* (2023.01)
(Continued)

(52) U.S. Cl.
CPC ......... *H10K 59/65* (2023.02); *G06V 40/1318* (2022.01); *H10K 59/122* (2023.02); *H10K 59/352* (2023.02); *H10K 59/353* (2023.02); *H10K 59/38* (2023.02); *H10K 59/8792* (2023.02)

(58) Field of Classification Search
CPC .... H10K 59/65; H10K 59/122; H10K 59/352; H10K 59/353; H10K 59/38; H10K 59/8792; H10K 59/12; H10K 59/126; H10K 59/40; H10K 59/60; H10K 50/865; G06V 40/1318; G06V 40/1324; G06V 40/13
See application file for complete search history.

(56) References Cited

U.S. PATENT DOCUMENTS

| | | | |
|---|---|---|---|
| 11,543,919 B2 | 1/2023 | Han et al. | |
| 2021/0249495 A1* | 8/2021 | Lee | ......................... H01L 25/18 |
| 2021/0357612 A1* | 11/2021 | Yang | ..................... H10F 39/198 |

(Continued)

FOREIGN PATENT DOCUMENTS

| | | |
|---|---|---|
| CN | 110399797 | 11/2019 |
| KR | 10-2020-0038388 | 4/2020 |

(Continued)

*Primary Examiner* — Kevin Quarterman
(74) *Attorney, Agent, or Firm* — F. CHAU & ASSOCIATES, LLC

(57) ABSTRACT

A display device includes: a substrate; a first light emitting part and a second light emitting part disposed on the substrate and emitting light; a light sensing part disposed on the substrate and sensing incident light; a first light blocking layer disposed on the first light emitting part, the second light emitting part, and the light sensing part and having a first transmission hole; and a second light blocking layer disposed on the first light blocking layer and having a second transmission hole, wherein the first transmission hole, the second transmission hole, and the first light emitting part overlap each other in a direction substantially perpendicular to an upper surface of the substrate.

20 Claims, 20 Drawing Sheets

(51) Int. Cl.
  H10K 59/38       (2023.01)
  H10K 59/80       (2023.01)

(56)               References Cited

U.S. PATENT DOCUMENTS

| | | | | |
|---|---|---|---|---|
| 2021/0409581 | A1* | 12/2021 | Hai | G02B 27/0988 |
| 2022/0067340 | A1* | 3/2022 | Han | G06F 3/042 |
| 2022/0113831 | A1* | 4/2022 | Hsueh | H10K 39/32 |
| 2022/0131018 | A1* | 4/2022 | Jeon | H10K 59/65 |
| 2022/0138449 | A1* | 5/2022 | Min | G02B 3/0006 |
| | | | | 382/124 |
| 2022/0190061 | A1* | 6/2022 | Baek | H10K 59/38 |
| 2022/0320170 | A1* | 10/2022 | Hai | H10F 39/8057 |
| 2023/0267759 | A1* | 8/2023 | Ku | G06F 21/32 |
| | | | | 345/156 |

FOREIGN PATENT DOCUMENTS

| | | |
|---|---|---|
| KR | 10-2020-0046817 | 5/2020 |
| KR | 10-2020-0081911 | 7/2020 |
| KR | 10-2022-0030004 A | 3/2022 |
| WO | 2022061769 A1 | 3/2022 |

* cited by examiner

BM: BM1, BM2

PX: EL, PDU
PS: PD, SDU

EA1b  EA1a  EA1c  RA  EA1d  NEA  10

PX1

EA2c
EA2b
EA2d  PX2
EA2a

EA1: EA1a, EA1b, EA1c, EA1d
EA2: EA2a, EA2b, EA2c, EA2d

EA1b  EA1a  EA1c  RA  EA1d  NEA

1_1

PX1

L1

II'

EA2c
EA2b
EA2d
EA2a

PX2

I  I'  II

BM1  CH1_1  TH1

EA1: EA1a, EA1b, EA1c, EA1d
EA2: EA2a, EA2b, EA2c, EA2d

Y
X
Z

1_2

EA1b  EA1a  EA1c  RA  EA1d  NEA

PX1

L1

EA2c
EA2b
EA2d  PX2
EA2a

II'

I  I'  II

BM1  CH1_2  TH1

EA1: EA1a, EA1b, EA1c, EA1d
EA2: EA2a, EA2b, EA2c, EA2d

EA1b  EA1a  EA1c  RA  EA1d  NEA

PX1

L2

EA2c
EA2b
EA2d  } PX2
EA2a

BM2  CH2  TH2

EA1: EA1a, EA1b, EA1c, EA1d
EA2: EA2a, EA2b, EA2c, EA2d

<Normal Mode>

EA1b   EA1a   EA1c   RA   EA1d   NEA

PX1

EA2c
EA2b
EA2d   PX2
EA2a

BM2   CH2   TH2

EA1: EA1a, EA1b, EA1c, EA1d
EA2: EA2a, EA2b, EA2c, EA2d

EA1: EA1a, EA1b, EA1c, EA1d

DISPLAY DEVICE

CROSS-REFERENCE TO RELATED APPLICATION

This application claims priority under 35 U.S.C. § 119 to Korean Patent Application No. 10-2022-0041135 filed on Apr. 1, 2022, in the Korean Intellectual Property Office, the disclosure of which is incorporated by reference herein in its entirety.

TECHNICAL FIELD

The present invention relates to a display device.

DISCUSSION OF THE RELATED

Display devices have been incorporated into various electronic devices such as smartphones, tablet personal computers (PCs), laptop computers, monitors, and televisions (TVs). Recently, due to the development of a mobile communication technology, the use of portable electronic devices such as smartphones, tablet PCs, and laptop computers has significantly increased. Since private or personal information may be stored in the portable electronic device, fingerprint authentication for authenticating a user's fingerprint, which is biometric information of a user, has been used to protect the private or personal information stored on the portable electronic device.

For example, the display device may authenticate the user's fingerprint using an optical method, an ultrasonic method, a capacitive method, or the like. The optical method may authenticate the user's fingerprint by sensing light reflected from the user's fingerprint. Generally, the display device may include a display panel, which includes pixels for displaying an image, and photo-sensors, which sense light to authenticate the user's fingerprint by the optical method.

SUMMARY

According to an embodiment of the present invention, a display device includes: a substrate; a first light emitting part and a second light emitting part disposed on the substrate and emitting light; a light sensing part disposed on the substrate and sensing incident light; a first light blocking layer disposed on the first light emitting part, the second light emitting part, and the light sensing part and having a first transmission hole; and a second light blocking layer disposed on the first light blocking layer and having a second transmission hole, wherein the first transmission hole, the second transmission hole, and the first light emitting part overlap each other in a direction substantially perpendicular to an upper surface of the substrate.

In an embodiment of the present invention, a minimum distance between the second light emitting part and the second light blocking layer is greater than a minimum distance between the first light emitting part and the second light blocking layer.

In an embodiment of the present invention, an area of the first transmission hole is substantially the same as an area of the second transmission hole.

In an embodiment of the present invention, the first light blocking layer, which includes the first transmission hole, and the second light blocking layer, which includes the second transmission hole, surround the first light emitting part.

In an embodiment of the present invention, the first light blocking layer includes a first light control hole overlapping the light sensing part in the direction substantially perpendicular to the upper surface of the substrate, and the second light blocking layer includes a second light control hole overlapping the light sensing part in the direction substantially perpendicular to the upper surface of the substrate.

In an embodiment of the present invention, a width of the first light control hole in one direction is greater than a width of the second light control hole in the one direction.

In an embodiment of the present invention, the second light blocking layer overlaps a portion of the light sensing part in the direction substantially perpendicular to the upper surface of the substrate.

In an embodiment of the present invention, the first light blocking layer does not overlap the light sensing part in the direction substantially perpendicular to the upper surface of the substrate.

In an embodiment of the present invention, an area of the first light control hole is greater than an area of the light sensing part.

In an embodiment of the present invention, the display device further includes a pixel defining layer disposed on the substrate and partitioning the light sensing part, wherein a portion of the first light blocking layer overlaps the pixel defining layer in the direction substantially perpendicular to the upper surface of the substrate.

In an embodiment of the present invention, an area of the first light control hole is substantially the same as an area of the light sensing part.

In an embodiment of the present invention, the first light control hole, the second light control hole, and the light sensing part overlap each other in the direction substantially perpendicular to the upper surface of the substrate.

In an embodiment of the present invention, a width of the first light control hole in one direction is substantially the same as a width of the second light control hole in the one direction.

In an embodiment of the present invention, a portion of the first light blocking layer and a portion of the second light blocking layer overlap the light sensing part in the direction substantially perpendicular to the upper surface of the substrate.

In an embodiment of the present invention, the substrate includes a first area, in which the second light emitting part and the light sensing part are disposed, and a second area, in which the first light emitting part is disposed, and the first area and the second area are spaced apart from each other.

According to an embodiment of the present invention, a display device includes: a substrate; a first light emitting part disposed on the substrate and emitting light; a light sensing part disposed on the substrate and sensing incident light; a pixel defining layer partitioning the first light emitting part and the light sensing part from each other; a first light blocking layer disposed on the first light emitting part, the light sensing part, and the pixel defining layer; and a second light blocking layer disposed on the first light blocking layer, wherein a portion of the second light blocking layer overlaps the light sensing part in a direction substantially perpendicular to an upper surface of the substrate.

In an embodiment of the present invention, the display device further includes: a transparent organic layer disposed between the first light blocking layer and the second light blocking layer; and a color filter disposed on the second light blocking layer.

In an embodiment of the present invention, an end of the pixel defining layer forming the first light emitting part overlaps an end of the first light blocking layer and an end of the second light blocking layer in the direction substantially perpendicular to the upper surface of the substrate.

In an embodiment of the present invention, the second light blocking layer includes a transmission hole overlapping the first light emitting part in the direction substantially perpendicular to the upper surface of the substrate, and the second light blocking layer does not overlap the first light emitting part.

In an embodiment of the present invention, the first light blocking layer includes a first light control hole, the second light blocking layer includes a second light control hole, and a width of the first light control hole in one direction is different from a width of the second light control hole in the one direction.

BRIEF DESCRIPTION OF THE DRAWINGS

The above and other features of the present invention will become more apparent by describing in detail embodiments thereof with reference to the accompanying drawings, in which.

4

Figure 18:
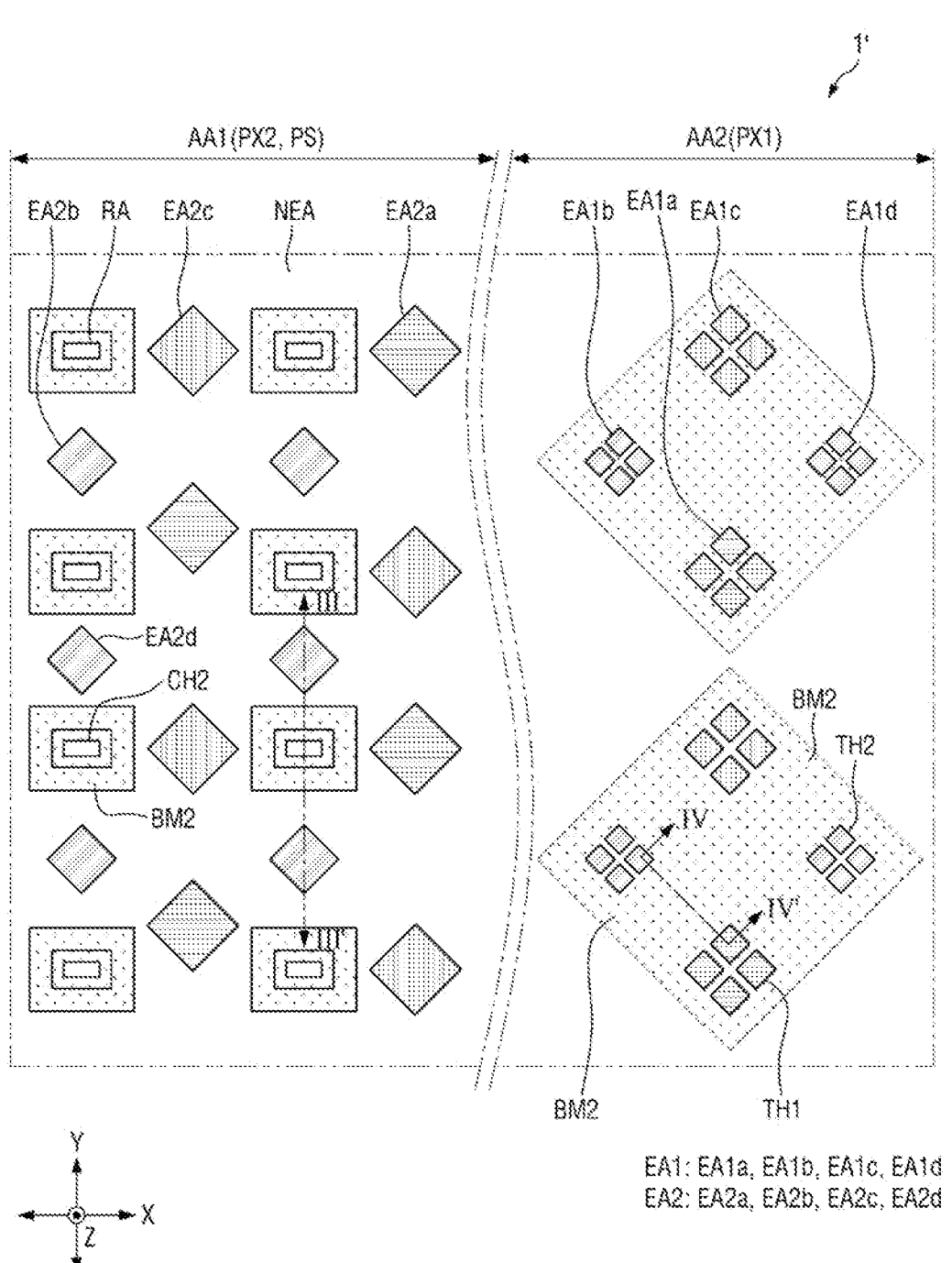
FIG. 18 is a plan layout view of pixels, photo-sensors, and a second light blocking layer of the display device according to an embodiment of the present invention.
Figure 19:
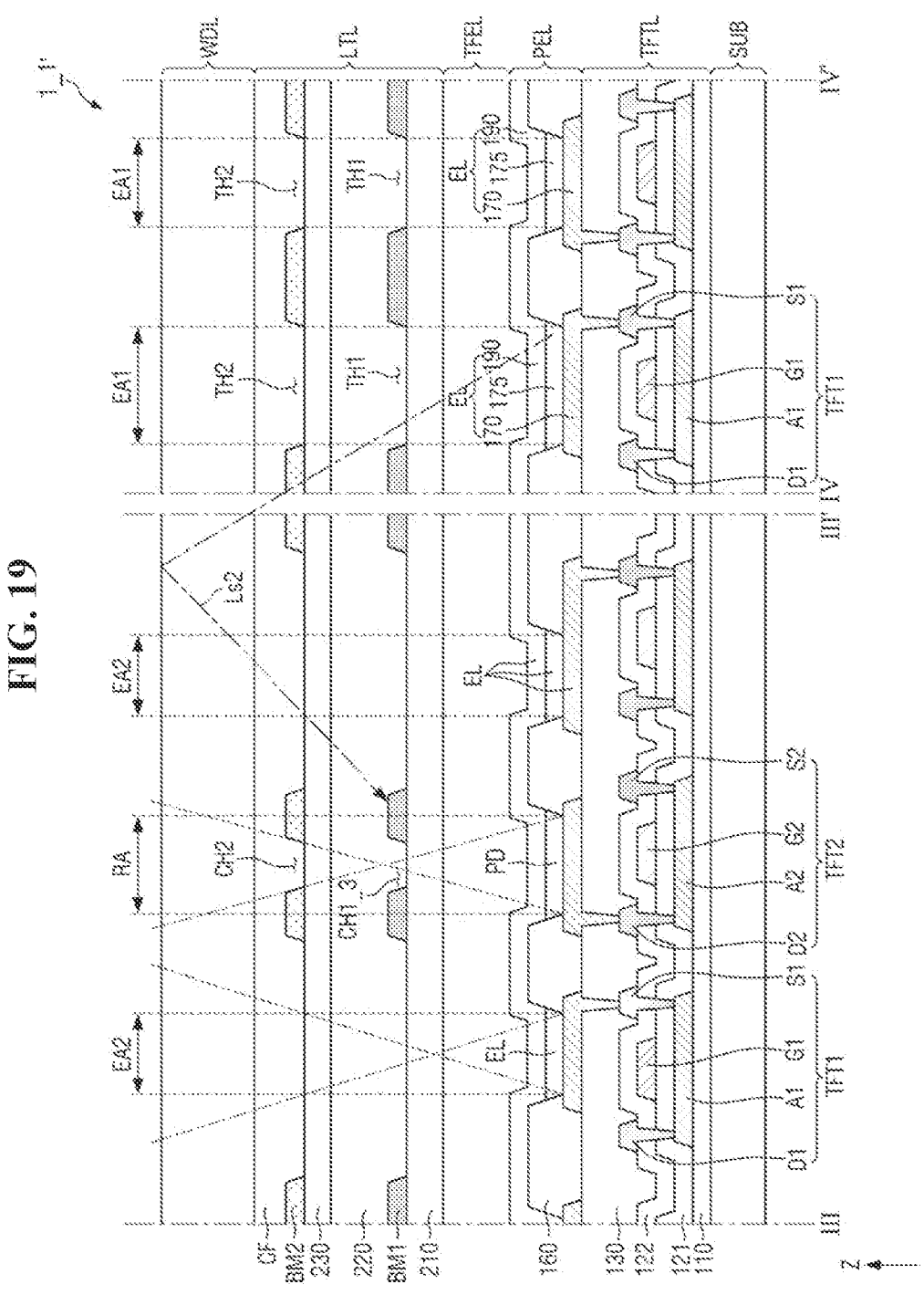
Figure 20:
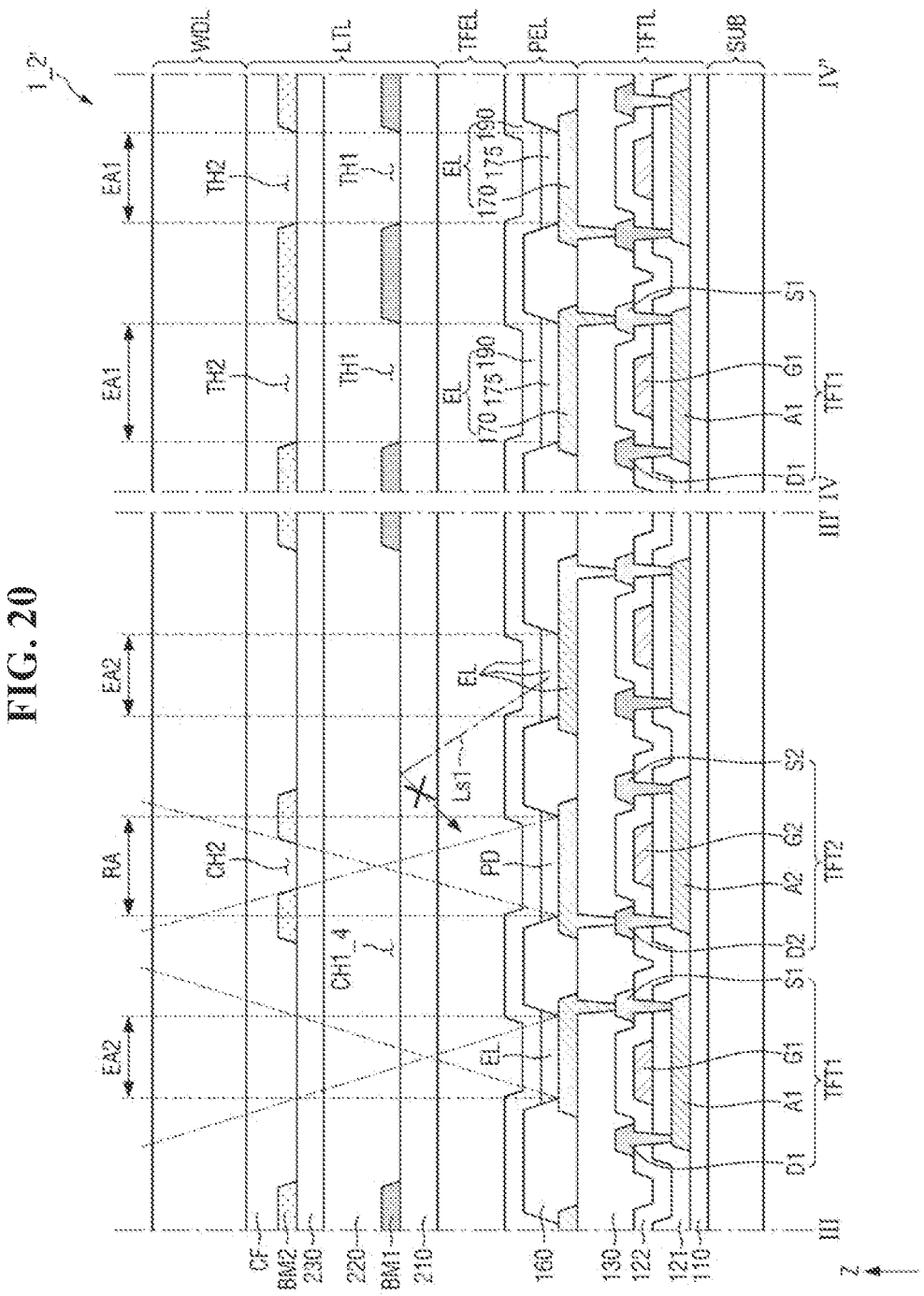

FIG. 19 is a cross-sectional view taken along line III-III' and line IV-IV' of FIG. 18; and FIG. 20 is a cross-sectional view taken along line III-III' and line IV-IV' of FIG. 18.

DETAILED DESCRIPTION OF THE EMBODIMENTS

The present invention will now be described more fully hereinafter with reference to the accompanying drawings, in which embodiments of the present invention are shown. This invention may, however, be embodied in different forms and should not be construed as being limited to the embodiments set forth herein.

It will also be understood that when a layer is referred to as being "on" another layer or substrate, it can be directly on the other layer or substrate, or intervening layers may also be present. The same reference numbers indicate the same components throughout the specification, and thus, repetitive descriptions may be omitted. In the drawings, various thicknesses, lengths, and angles are shown and while the arrangement shown does indeed represent an embodiment of the present invention, it is to be understood that modifications of the various thicknesses, lengths, and angles may be possible within the spirit and scope of the present invention and the present invention is not necessarily limited to the particular thicknesses, lengths, and angles shown.

Although the terms "first", "second", etc. may be used herein to describe various elements, these elements, should not be limited by these terms. These terms may be used to distinguish one element from another element. For example, a first element discussed below may be termed a second element without departing from the spirit and scope of the present invention. The description of an element as a "first" element might not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, embodiments of the present invention will be described with reference to the accompanying drawings.

Figure 1:
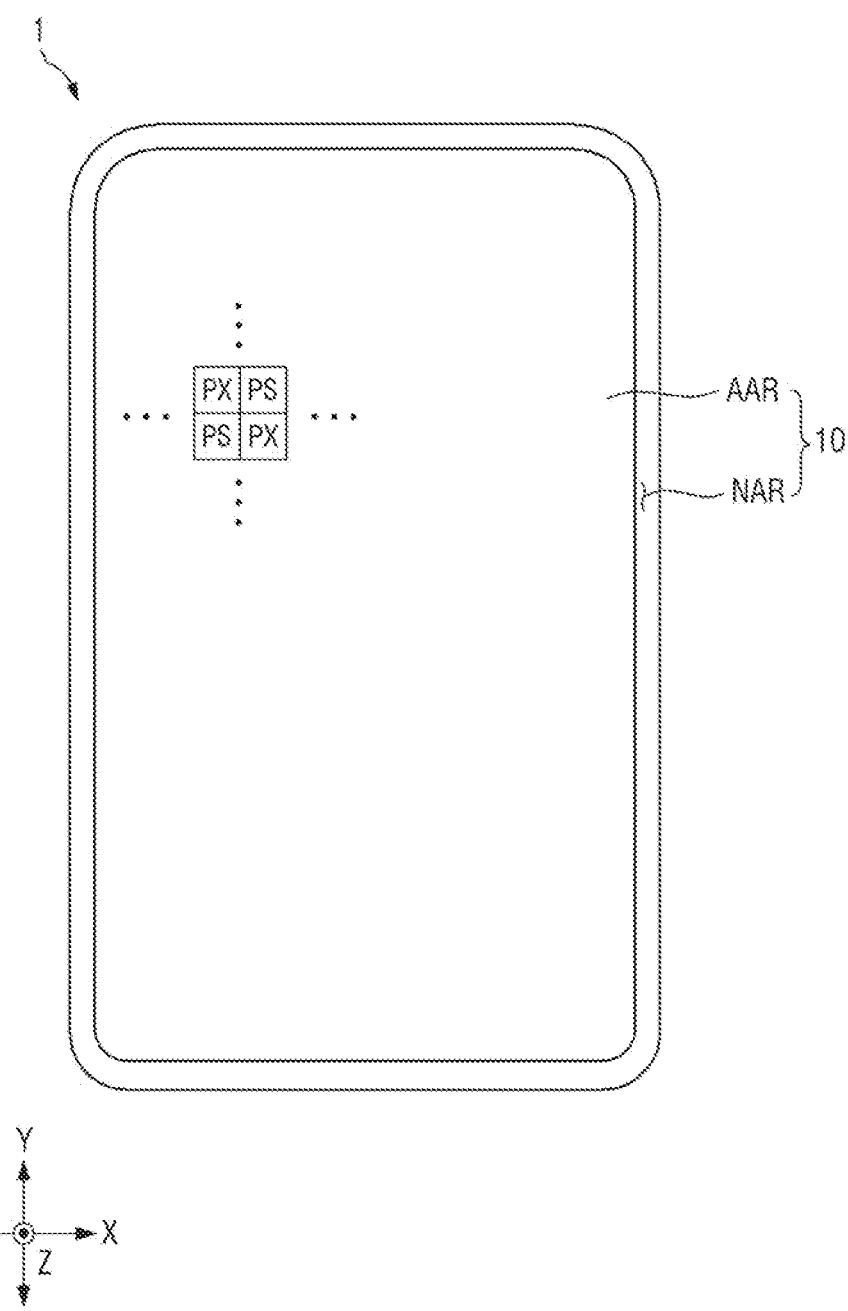
FIG. 1 is a plan view illustrating a display device according to an embodiment of the present invention.

FIG. 1 is a plan view illustrating a display device according to an embodiment of the present invention.

In FIG. 1, a first direction X, a second direction Y, and a third direction Z are indicated. The first direction X is a direction parallel to one side of a display device 1 in a plan view, and may be, for example, a transverse direction of the display device 1. The second direction Y is a direction parallel to the other side of the display device 1 in contact with one side of the display device 1 in a plan view, and may be a longitudinal direction of the display device 1. Hereinafter, for convenience of explanation, one side in the first direction X refers to a right direction in a plan view, the other side in the first direction X refers to a left direction in a plan view, one side in the second direction Y refers to an upper direction in a plan view, and the other side in the second direction Y refers to a lower direction in a plan view. The third direction Z may be a thickness direction of the display device 1. However, it is to be understood that directions mentioned in embodiments refer to relative directions, and embodiments of the present invention are not limited to the mentioned directions.

Unless otherwise defined, the terms "above" and "upper surface" expressed with respect to the third direction Z as used herein refer to a display surface side with respect to a display panel 10, and the terms "below" and "lower surface", and "rear surface" expressed with respect to the third direction Z as used herein refer to a side opposite to a display surface with respect to the display panel 10.

Referring to FIG. 1, the display device 1 may include various electronic devices providing a display screen. Examples of the display device 1 may include, but are not limited to, mobile phones, smartphones, tablet personal computers (PCs), mobile communication terminals, electronic notebooks, electronic books, personal digital assistants (PDAs), portable multimedia players (PMPs), navigation devices, ultra mobile PCs (UMPCs), televisions, game machines, wrist watch-type electronic devices, head-mounted displays, monitors of personal computers, laptop computers, vehicle instrument boards, digital cameras, camcorders, external billboards, electric signs, various medical devices, various inspection devices, various home appliances including display areas, such as refrigerators and washing machines, Internet of Things (IoT) devices, or the like. Representative examples of a display device 1 to be described later may include, but are not limited to, smartphones, tablet PCs, laptop computers, or the like.

The display device 1 includes the display panel 10 having an active area AAR and a non-active area NAR. The active area AAR includes a display area in which an image is displayed. The active area AAR may overlap the display area. For example, the active area AAR may completely overlap the display area. A plurality of pixels PX displaying an image may be disposed in the display area. Each pixel PX may include a light emitting element 'EL' (see FIG. 5).

The active area AAR further includes a light sensing area. The light sensing area is an area that responds to light, and is an area configured to sense an amount, a wavelength, or the like, of incident light. The light sensing area may overlap the display area. For example, the light sensing area may be defined as an area exactly the same as the display area in a plan view. In this case, a front surface of the display area of the display device 1 may be an area for fingerprint sensing. As another example, the light sensing area may be disposed only in a limited area for fingerprint recognition. In this case, the light sensing area may overlap a portion of the display area, but might not overlap another portion of the display area.

The light sensing area of the active area AAR further includes a plurality of photo-sensors PS responding to light. Each photo-sensor PS may include a photoelectric conversion element PD (see FIG. 5) that senses incident light and converts the incident light into an electrical signal.

The non-active area NAR is disposed adjacent to the active area AAR. The non-active area NAR may be a bezel area. The non-active area NAR may surround at least a portion of the active area AAR. For example, the non-active area NAR may surround all sides (e.g., four sides in FIG. 1) of the active area AAR, but the present invention is not limited thereto. Signal lines transferring signals and voltages to the display panel 10 may be disposed in the non-active area NAR.

Figure 2:
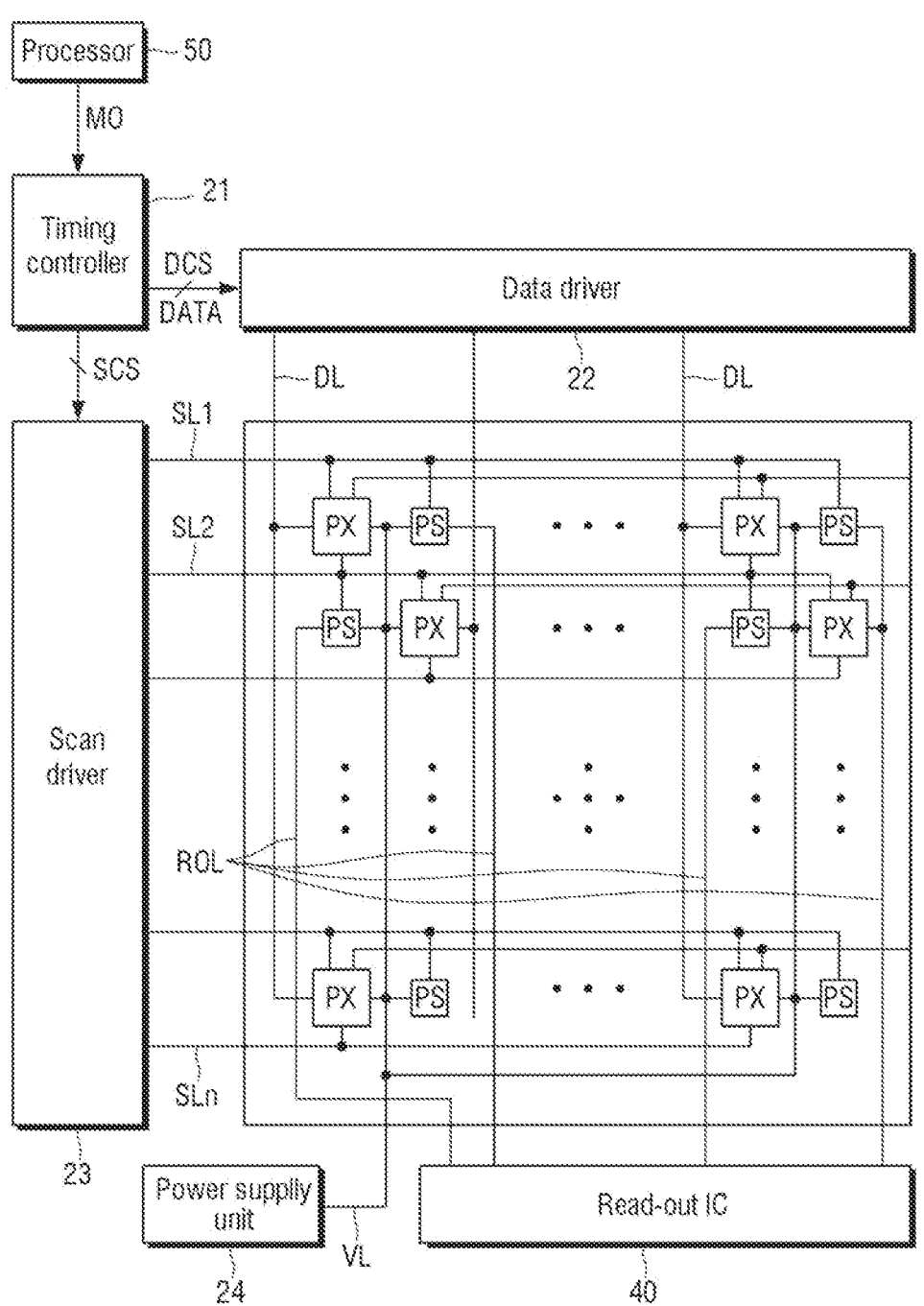
FIG. 2 is a block diagram of the display device according to an embodiment of the present invention.

FIG. 2 is a block diagram of the display device according to an embodiment of the present invention.

Referring to FIG. 2, the display device 1 according to present embodiment includes a processor 50, a display driving circuit 20, and a read-out circuit 40.

The processor 50 supplies an image signal and a plurality of control signals supplied from the outside (e.g., an external device or a host device) to a timing controller 21. The image signal is an image source on which graphic processing has been completed, and may be provided to the timing controller 21. The plurality of control signals include a vertical synchronization signal, a horizontal synchronization signal, a clock signal, an enable signal, and the like. In addition, the plurality of control signals include a mode control signal MO for controlling a private mode and a normal mode.

The display driving circuit 20 may generate signals and voltages for driving the pixels PX and the photo-sensors PS of the display panel 10. The display driving circuit 20 may be formed as an integrated circuit (IC) and attached onto a circuit board in a chip on film (COF) manner, but the present invention is not limited thereto.

The display driving circuit 20 includes a data driver 22 driving the pixels PX of the display panel 10, a scan driver 23 driving the pixels PX and the photo-sensors PS, the timing controller 21 for controlling driving timings of the data driver 22 and the scan driver 23, and a power supply unit 24.

The timing controller 21 receives the image signal and the plurality of control signals supplied from the processor 50. The timing controller 21 may output image data DATA and a data control signal DCS to the data driver 22. In addition, the timing controller 21 may generate a scan control signal SCS for controlling an operation timing of the scan driver 23. For example, the timing controller 21 may generate a scan control signal SCS and output the scan control signal SCS to the scan driver 23 through a scan control line.

The data driver 22 may convert the image data DATA into analog data voltages and output the analog data voltages to data lines DL. The scan driver 23 may generate scan signals according to the scan control signal SCS, and sequentially output the scan signals to scan lines SL1 to SLn.

The power supply unit 24 may generate a first source voltage ELVDD (see FIG. 5), and supply the first source voltage ELVDD to a source voltage line VL. In addition, the power supply unit 24 may generate a second source voltage ELVSS (see FIG. 5), and supply the second source voltage ELVSS to the source voltage line VL. The source voltage line VL may include a first source voltage line and a second source voltage line. The first source voltage ELVDD may be a high potential voltage for driving light emitting elements of the pixels PX and photoelectric conversion elements of the photo-sensors PS, and the second source voltage ELVSS may be a low potential voltage for driving the light emitting elements and the photoelectric conversion elements.

The plurality of photo-sensors PS disposed in the active area AAR of the display panel 10 are connected to the read-out circuit 40. The read-out circuit 40 may be connected to the respective photo-sensors PS through read-out lines ROL, and may receive currents flowing to the respective photo-sensors PS to sense a user's fingerprint input.

The read-out circuit 40 may generate fingerprint sensed data according to a magnitude of a current sensed by each photo-sensor PS, and transmit the fingerprint sensed data to the processor 50. The processor 50 may determine whether or not a fingerprint coincides with a user's fingerprint through a comparison with a preset fingerprint by analyzing the fingerprint sensed data.

Each of the plurality of pixels PX may be connected to at least one of the scan lines SL1 to SLn, any one of the data lines DL, and the source voltage line VL. Each of the plurality of photo-sensors PS may be connected to any one of the scan lines SL1 to SLn, any one of the read-out lines ROL, and the source voltage line VL.

Hereinafter, processes in which a normal mode and a private mode are operated according to a mode control signal MO will be described in conjunction with FIG. 2 and FIG. 3.

Figure 3:
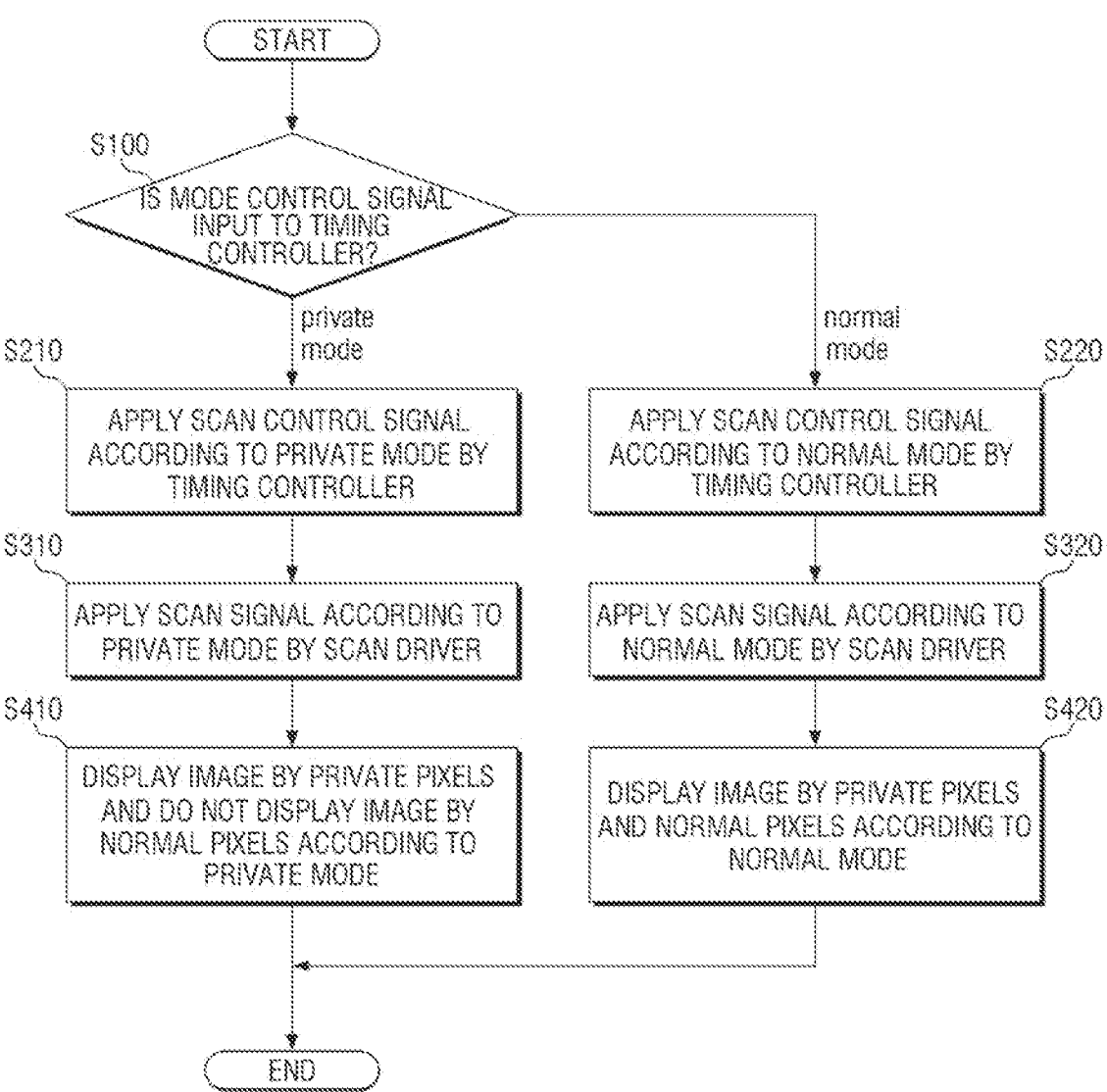
FIG. 3 is a flowchart illustrating processes in which a normal mode and a private mode are operated according to an embodiment of the present invention.

FIG. 3 is a flowchart illustrating processes in which a normal mode and a private mode are operated according to an embodiment of the present invention.

In the present embodiment, the processor 50 supplies the mode control signal MO to the timing controller 21. The mode control signal MO is a signal for controlling the private mode and the normal mode of the display device 1, and may be provided to the timing controller 21. The timing controller 21 receives the mode control signal MO supplied from the processor 50 as an input (S100).

For example, when the normal mode is performed according to the mode control signal MO (S100: normal mode), the timing controller 21 may output the scan control signal SCS and the data control signal DCS to the scan driver 23 and the data driver 22, respectively, according to the mode control signal MO (S220). The scan driver 23 and the data driver 22 may generate scan signals and data voltages, respectively, and sequentially output the scan signals and the data voltages to the scan lines SL1 to SLn and the data lines DL, respectively (S320). Accordingly, the plurality of pixels PX connected to the scan lines SL1 to SLn and the data lines DL may display an image (S420). The plurality of pixels PX includes first pixels PX1 (see FIG. 6) defined as private pixels and second pixels PX2 (see FIG. 6) defined as normal pixels.

In addition, when the private mode is performed according to the mode control signal MO (S100: private mode), the timing controller 21 may output the scan control signal SCS and the data control signal DCS to the scan driver 23 and the data driver 22, respectively, according to the mode control signal MO to display an image of the first pixels PX1 (S210). The scan driver 23 and the data driver 22 may output the scan signals and the data voltages to the scan lines SL1 to SLn and the data lines DL connected to the first pixels PX1, respectively (S310). That is, in the private mode, the second pixels PX2 defined as the normal pixels might not display an image, and the first pixels PX1 defined as the private pixels may display an image (S410).

The display device 1 may control whether an image is displayed by the first pixels PX1 or the second pixels PX2 by controlling the private mode and the normal mode, if necessary. In the normal mode, an image having a general viewing angle may be displayed, and in the private mode, an image having a limited viewing angle may be displayed. Accordingly, it is possible to prevent a third person, who is not a user viewing a front surface of the display device 1 and who views the display device 1 from a side surface of the display device 1, from identifying the display device 1 and viewing the images or information that the user is viewing.

Figure 4:
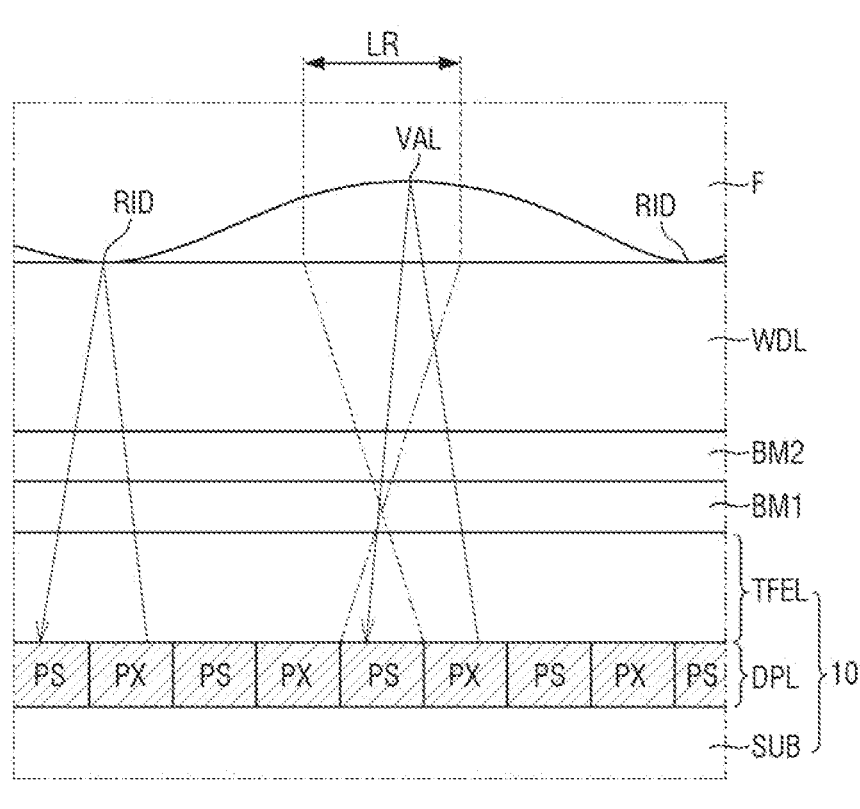
FIG. 4 is an illustrative view illustrating fingerprint sensing of the display device according to an embodiment of the present invention.
Figure 4:

FIG. 4 is an illustrative view illustrating fingerprint sensing of the display device according to an embodiment of the present invention.

Referring to FIG. 4, the display device 1 may further include a first light blocking layer BM1, a second light blocking layer BM2, and a window WDL disposed on the display panel 10. The display panel 10 may include a substrate SUB, a display layer DPL, and an encapsulation layer TFEL. The display layer DPL may be disposed on the substrate SUB and may include the pixels PX and the photo-sensors PS. The encapsulation layer TFEL may be disposed on the display layer DPL. In addition, the display layer DPL includes a thin film transistor layer TFTL and a photoelectric element layer PEL of FIG. 13.

When a user's finger comes into contact with an upper surface of the window WDL of the display device 1, light output from the pixels PX of the display panel 10 may be reflected from ridges RID and valleys VAL between the ridges RID of the user's fingerprint F. In this case, a ridge RID portion of the fingerprint F is in contact with the upper surface of the window WDL, whereas a valley VAL portion of the fingerprint F is not contact with the window WDL. For example, the upper surface of the window WDL is in contact with air in the valley VAL portion.

When the fingerprint F is in contact with the upper surface of the window WDL, light output from a light emitting part of the pixel PX may be reflected from the ridge RID and the valley VAL of the fingerprint F. In this case, a refractive index of the fingerprint F and a refractive index of the air between the valley VAL and the window WDL are different from each other, and thus, an amount of light reflected from the ridge RID of the fingerprint F and an amount of light reflected from the valley VAL of the fingerprint F may be different from each other. Accordingly, the ridge RID portion and the valley VAL portion of the fingerprint F may be derived based on a difference between amounts of the reflected light, that is, light incident on the photo-sensor PS. Since the photo-sensor PS outputs an electrical signal (or a photocurrent) according to the difference between the amounts of light, a fingerprint F pattern of the finger may be identified.

In addition, a viewing angle of light emitted from the pixel PX may be adjusted by the first light blocking layer BM1 and the second light blocking layer BM2. An area LR of light incident on the photo-sensor PS may be defined by the first light blocking layer BM1 and the second light blocking layer BM2. As the area LR of the light incident on the photo-sensor PS decreases, an amount of front surface light incident on a front surface of the photo-sensor PS may increase. In addition, an amount of lateral light incident on a side surface of the photo-sensor PS may decrease. As the amount of the front surface light incident on the front surface of the photo-sensor PS increases and the amount of the lateral light incident on the side surface of the photo-sensor PS decreases, an amount of noise light of the photo-sensor PS may decrease. When the amount of the noise light decreases, the photo-sensor PS may identify a fingerprint F pattern with a high resolution. In other words, as the area LR of the light incident on the photo-sensor PS decreases, the fingerprint F pattern having the high resolution may be identified. A structure of the display device 1 for controlling the area LR of the light defined by the first light blocking layer BM1 and the second light blocking layer BM2 will be described in detail with reference to FIGS. 13 to 16.

In addition, the front surface light as used herein refers not only to light incident on the photo-sensor PS with an angle of about 90°, but also light having an angle that may be incident on the photo-sensor PS within the area LR of the light that is defined. Accordingly, when the area LR of the light is inclined by about 30° in a lateral direction from a normal perpendicular to the photo-sensor PS, for example, the front surface light may include light incident on the photo-sensor PS with an inclined angle of about 30°.

In addition, the lateral light refers to light incident on the photo-sensor PS with a high inclined angle from the normal perpendicular to the photo-sensor PS as compared with the front surface light. Accordingly, the lateral light might not be incident on the area LR of the light that is defined, and may be incident on the photo-sensor PS from a side surface more than the area LR of the light that is defined. The photo-sensor PS recognizes the lateral light as noise light. The lateral light acting as the noise light on the photo-sensor PS may include a first lateral light Ls1 (see FIG. 14) and a second lateral light Ls2 (see FIG. 14). The first lateral light Ls1 (see FIG. 14) may be reflected from a lower surface of the first light blocking layer BM1 and may be incident on the photo-sensor PS, and the second lateral light Ls2 (see FIG. 14) may be reflected from the upper surface of the window WDL but is transmitted in an area other than the area LR of the light and is incident on the photo-sensor PS.

Figure 5:
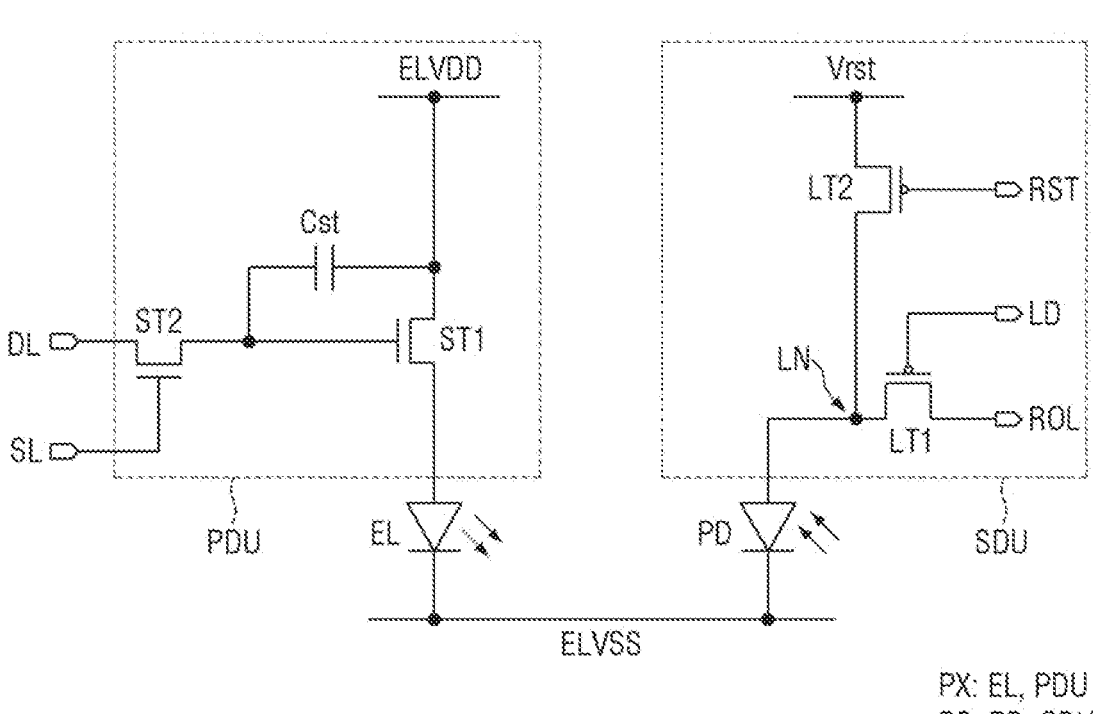
FIG. 5 is a circuit diagram illustrating a pixel and a photo-sensor according to an embodiment of the present invention.

FIG. 5 is a circuit diagram illustrating a pixel and a photo-sensor according to an embodiment of the present invention.

Referring to FIG. 5, the pixel PX may include a light emitting element EL and a pixel driver PDU controlling an amount of light emitted from the light emitting element EL. The pixel driver PDU may include a capacitor Cst, a first transistor ST1, and a second transistor ST2. The pixel driver PDU may receive a data signal from the data line DL connected thereto, a scan signal from the scan line SL connected thereto, a first source voltage ELVDD, and a second source voltage ELVSS.

The light emitting element EL may be an organic light emitting diode including an organic light emitting layer disposed between an anode electrode and a cathode electrode. In addition, the light emitting element EL may be a quantum dot light emitting element including a quantum dot light emitting layer disposed between an anode electrode and a cathode electrode. In addition, the light emitting element EL may be an inorganic light emitting element including an inorganic semiconductor disposed between an anode electrode and a cathode electrode. When the light emitting element EL is an inorganic light emitting element, the light emitting element EL may include a micro light emitting diode or a nano light emitting diode.

Figure 13:
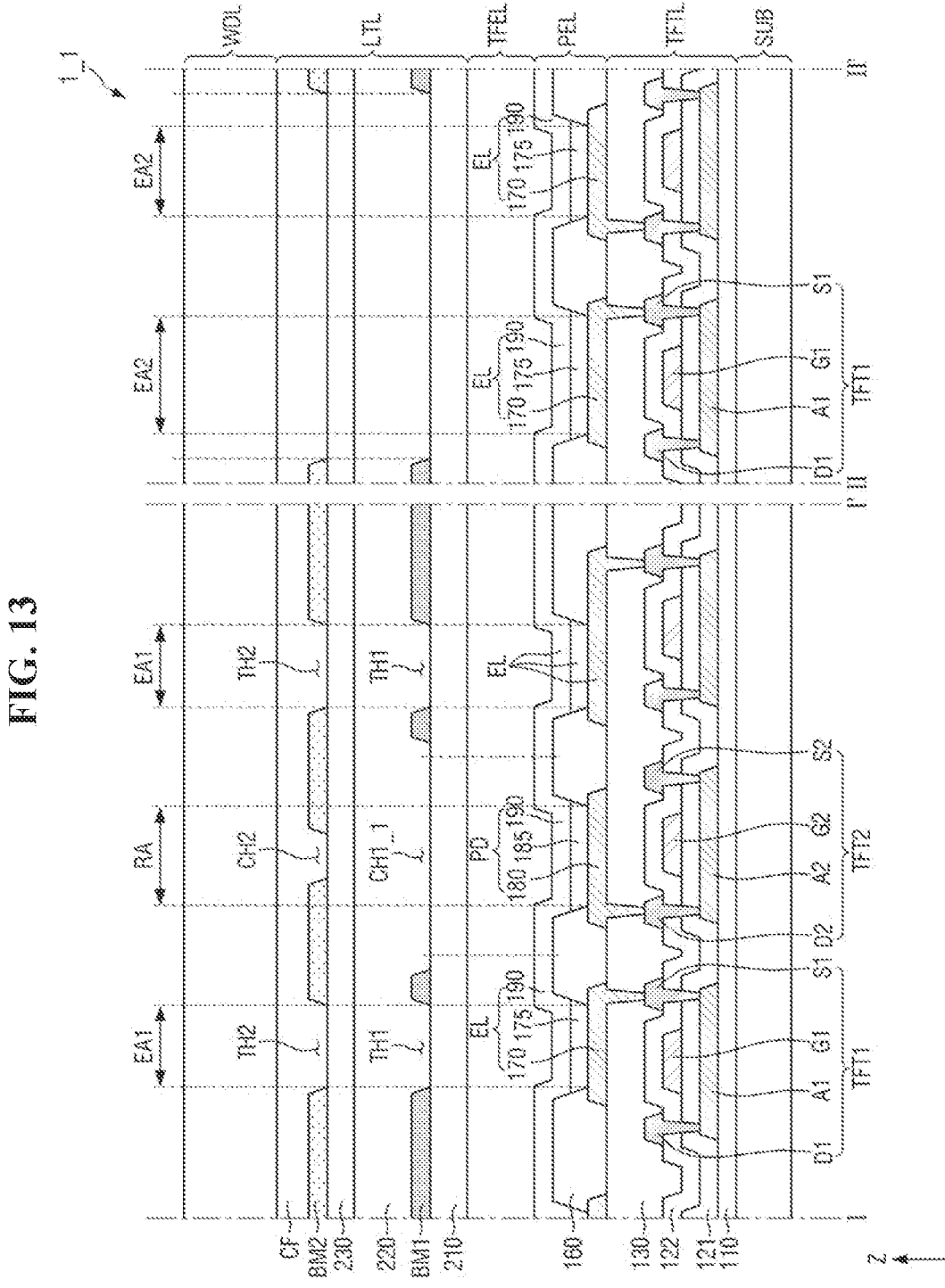
FIG. 13 is a cross-sectional view taken along line I-I' and line II-II' of FIGS. 7 and 9.

The light emitting element EL may emit light with a predetermined luminance according to an anode voltage and a cathode voltage. The anode electrode of the light emitting element EL is connected to the first transistor ST1, and the cathode electrode of the light emitting element EL is connected to a second source voltage ELVSS terminal. In FIG. 13, the anode electrode of the light emitting element EL corresponds to a pixel electrode 170, and the cathode electrode of the light emitting element EL corresponds to a common electrode 190.

The capacitor Cst is connected between a gate electrode of the first transistor ST1 and a first source voltage ELVDD terminal. The capacitor Cst includes a first capacitor electrode, which is connected to the gate electrode of the first transistor ST1, and a second capacitor electrode, which is connected to the first source voltage ELVDD terminal. The capacitor Cst may be charged with a voltage corresponding to a data signal received from the second transistor T2.

The first transistor ST1 may be a driving transistor, and the second transistor ST2 may be a switching transistor. Each of the first and second transistors ST1 and ST2 may include a gate electrode, a source electrode, and a drain electrode. One of the source electrode or the drain electrode may be one electrode, and the other of the source electrode and the drain electrode may be the other electrode. Hereinafter, for convenience of explanation and clarity, a case where the drain electrode is one electrode and the source electrode is the other electrode will be described by way of example.

The first transistor ST1 may be the driving transistor and generate a driving current. The gate electrode of the first transistor ST1 is connected to the first capacitor electrode. The one electrode of the first transistor ST1 is connected to the first source voltage ELVDD terminal and the second capacitor electrode, and the other electrode of the first transistor ST1 is connected to the anode electrode of the light emitting element EL. The first transistor ST1 may control the driving current flowing to the light emitting element EL according to a quantity of charges stored in the capacitor Cst.

The second transistor ST2 is the switching transistor. The gate electrode of the second transistor ST2 is connected to the scan line SL. The one electrode of the second transistor ST2 is connected to the data line DL, and the other electrode of the second transistor ST2 is connected to one electrode of the first transistor ST1. The second transistor ST2 may be turned on according to a scan signal of the scan line SL to perform a switching operation of transferring a data signal to the one electrode of the first transistor ST1.

However, this is only an example, and the pixel driver PDU may also have a 3T1C or 7T1C structure in which it further includes a compensation circuit compensating for a threshold voltage deviation ΔVth of the first transistor ST1, or the like.

Each of the plurality of photo-sensors PS may include a photoelectric conversion element PD and a sensing driver SDU that controls a sensing current according to a photocurrent of the photoelectric conversion element PD. The sensing driver SDU may include a sensing transistor LT1, which controls the sensing current generated from the photoelectric conversion element PD, and a reset transistor LT2. The sensing driver SDU may receive a reset signal through a reset signal line RST connected to the sensing driver SDU, a fingerprint scan signal through a fingerprint scan line LD connected to the sensing driver SDU, a reset voltage Vrst, and a second source voltage ELVSS. In addition, the sensing driver SDU is connected to the read-out line ROL. In addition, the fingerprint scan line LD may be used in common with the scan line SL connected to the pixel driver PDU.

Each of the photoelectric conversion elements PD may be a photodiode including a sensing anode electrode, a sensing cathode electrode, and a photoelectric conversion layer disposed between the sensing anode electrode and the sensing cathode electrode. Each of the photoelectric conversion elements PD may convert light incident from the outside into an electrical signal. The photoelectric conversion element PD may be an inorganic photodiode or a phototransistor made of a pn-type or pin-type inorganic material. In addition, the photoelectric conversion element PD may be an organic photodiode including an electron donating material generating donor ions and an electron accepting material generating acceptor ions.

The sensing anode electrode of the photoelectric conversion element PD may be connected to a sensing node LN, and the sensing cathode electrode of the photoelectric conversion element PD may be connected to the second source voltage ELVSS terminal to receive the second source voltage ELVSS. The sensing anode electrode of the photoelectric conversion element PD corresponds to a first electrode 180 of FIG. 13, and the sensing cathode electrode of the photoelectric conversion element PD corresponds to a common electrode 190.

The photoelectric conversion element PD may generate photocharges when it is exposed to external light, and the generated photocharges may be accumulated in the sensing anode electrode of the photoelectric conversion element PD. In this case, a voltage of the sensing node LN electrically connected to the sensing anode electrode may increase. When the photoelectric conversion element PD is connected to the read-out line ROL, the sensing voltage may be accumulated in the read-out line ROL in proportion to an accumulated voltage of the sensing node LN.

The sensing transistor LT1 may have a gate electrode, which is connected to the fingerprint scan line LD, one electrode, which is connected to the sensing node LN, and the other electrode, which is connected to the read-out line ROL. The sensing transistor LT1 is turned on according to the fingerprint scan signal of the fingerprint scan line LD so that a current flowing to the photoelectric conversion element PD is transferred to the read-out line ROL.

The reset transistor LT2 may have a gate electrode, which is connected to the reset signal line RST, one electrode, which is connected to a reset voltage Vrst terminal, and the other electrode, which is connected to the sensing node LN. In this case, the sensing node LN and the sensing anode electrode of the photoelectric conversion element PD may be reset to the reset voltage Vrst in response to a reset signal received through the reset signal line RST.

A case where each transistor is either an N-channel metal oxide semiconductor (NMOS) or P-channel metal oxide semiconductor (PMOS) transistor has been illustrated in FIG. 5, but the present invention is not limited thereto.

Figure 6:
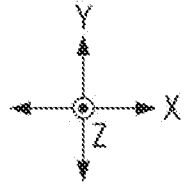
FIG. 6 is a plan layout view of pixels and photo-sensors of a display panel according to an embodiment of the present invention.

FIG. 6 is a plan layout view of pixels and photo-sensors of a display panel according to an embodiment.

Referring to FIG. 6, a plurality of pixels PX: PX1 and PX2 included in the display panel 10 may include first pixels PX1 and second pixels PX2. The first pixels PX1 may receive the scan signals and the data signals in response to the private mode. Accordingly, the first pixels PX1 may display an image with a limited viewing angle in response to the private mode. The second pixels PX2 may receive the scan signals and the data signals in response to the normal mode. Accordingly, the second pixels PX2 may display an image with a general viewing angle in response to the normal mode. Accordingly, the photo-sensors PS included in the display panel 10 may utilize light emitted from the first pixels PX1 as a light source according to the private mode or utilize light emitted from the first pixels PX1 and the second pixels PX2 as a light source according to the normal mode.

The plurality of pixels PX1 and PX2 included in the display panel 10 may include a plurality of light emitting parts EA1 and EA2 emitting light, in the active area AAR (or the display area). The first pixels PX1 include first light emitting parts EA1, and the second pixels PX2 include second light emitting parts EA2. The plurality of light emitting parts EA1 and EA2 may be areas in which the pixel electrodes 170 are exposed by openings of a pixel defining layer 160 and areas in which the exposed pixel electrodes 170 and emission layers 175 overlap each other, in cross-sectional view.

Each of the plurality of light emitting parts EA1 and EA2 may include a first sub-light emitting part, a second sub-light emitting part, a third sub-light emitting part, and a fourth sub-light emitting part. For example, the first light emitting part EA1 may include a first sub-light emitting part EA1a, which emits red light, a second sub-light emitting part EA1b, which emits green light, a third sub-light emitting part EA1c, which emits blue light, and a fourth sub-light emitting part EA1d, which emits green light. Likewise, the second light emitting part EA2 may include a first sub-light emitting part EA2a, a second sub-light emitting part EA2b, a third sub-light emitting part EA2c, and a fourth sub-light emitting part EA2d.

The plurality of photo-sensors PS included in the display panel 10 may include a plurality of light sensing parts RA sensing incident light, within the active area AAR (or the light sensing area). The light sensing parts RA may be areas in which the first electrodes 180 are exposed by openings of the pixel defining layer 160 and areas in which the exposed first electrodes 180 and photoelectric conversion layers 185 overlap each other, in cross-sectional view.

A non-emission area is disposed between the light emitting parts EA1 and EA2 of the respective pixels PX1 and PX2. In addition, a non-sensing area is disposed between the light sensing parts RA of the respective photo-sensors PS. In the present embodiment, an area in which the non-emission area and the non-sensing area overlap each other will be referred to as a peripheral part NEA.

A plurality of sub-light emitting parts EA1a, EA1b, EA1c, EA1d, EA2a, EA2b, EA2c, and EA2d may be spaced apart from each other in the first direction X and the second direction Y. For example, the first sub-light emitting parts EA1a and EA2a and the third sub-light emitting parts EA1c and EA2c may be alternately arranged in the first direction X and the second direction Y. For example, the first sub-light emitting parts EA1a and the third sub-light emitting parts EA1c of the first pixel PX1 are alternately arranged in the second direction Y, and the first sub-light emitting parts EA2a and the third sub-light emitting parts EA2c of the second pixel PX2 are alternately arranged in the second direction Y. As an additional example, the first sub-light emitting parts EA1a of the first pixel PX1 and the third sub-light emitting parts EA2c of the second PX2 are alternately arranged in the first direction X, and the third sub-light emitting parts EA1c of the first pixel PX1 and the first sub-light emitting parts EA2a of the second PX2 are alternately arranged in the first direction X. The second sub-light emitting parts EA1b and EA2b and the fourth sub-light emitting parts EA1d and EA2d may be alternately arranged in the first direction X and the second direction Y. For example, the second sub-light emitting parts EA1b and the fourth sub-light emitting parts EA1d of the first pixel PX1 are alternately arranged in the first direction X, and the second sub-light emitting parts EA2b and the fourth sub-light emitting parts EA2d of the second pixel PX2 are alternately arranged in the first direction X. As an additional example, the second sub-light emitting parts EA1b of the first pixel PX1 and the fourth sub-light emitting parts EA2d of the second PX2 are alternately arranged in the second direction Y, and the fourth sub-light emitting parts EA1d of the first pixel PX1 and the second sub-light emitting parts EA2b of the second PX2 are alternately arranged in the second direction Y.

The light sensing part RA may neighbor to the sub-light emitting parts EA1a, EA1b, EA1c, and EA1d of the first light emitting part EA1. For example, the light sensing part RA may be disposed between the second sub-light emitting part EA1b and the fourth sub-light emitting part EA1d neighboring to each other in the first direction X, and may be disposed between the first sub-light emitting part EA1a and the third sub-light emitting part EA1c neighboring to each other in the second direction Y.

The plurality of sub-light emitting parts EA1a, EA1b, EA1c, EA1d, EA2a, EA2b, EA2c, and EA2d may have different sizes from each other, respectively. A size of the first sub-light emitting parts EA1a and EA2a may be greater than each of sizes of the second sub-light emitting parts EA1b and EA2b and the fourth sub-light emitting parts EA1d and EA2d, and may be smaller than a size of the third sub-light emitting parts EA1c and EA2c. The size of the second sub-light emitting parts EA1b and EA2b may be substantially the same as the size of the fourth sub-light emitting parts EA1d and EA2d.

Each of the first sub-light emitting parts EA1a and EA2a, the second sub-light emitting parts EA1b and EA2b, the third sub-light emitting parts EA1c and EA2c, the fourth sub-light emitting parts EA1d and EA2d, and the light sensing parts RA may have a rectangular shape such as a rhombic shape in a plan view, but the present invention is not limited thereto, and for example, may have an octagonal shape or other polygonal shapes in a plan view.

Figure 7:
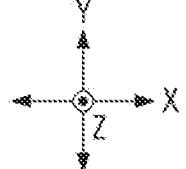
FIG. 7 is a plan layout view of FIG. 6 and a first light blocking layer according to an embodiment of the present invention.

FIG. 7 is a plan layout view of FIG. 6 and a first light blocking layer according to an embodiment of the present invention.

Referring to FIG. 7, a display device 1_1 may further include a first light blocking layer BM1 disposed on the display panel 10 that includes the light emitting parts EA1 and EA2 and the light sensing parts RA.

The first light blocking layer BM1 may be disposed to overlap the peripheral parts NEA adjacent to the first light emitting parts EA1 and the light sensing parts RA of the first pixels PX1 in the third direction Z. The first light blocking layer BM1 might not overlap the peripheral parts NEA adjacent to the second light emitting parts EA2 of the second pixels PX2 in the third direction Z. The first light blocking layer BM1 may be disposed around the first light emitting parts EA1 to limit a viewing angle of light emitted from the first light emitting parts EA1, and may be disposed around the light sensing parts RA to limit an area of light incident on the light sensing parts RA.

The first light blocking layer BM1 may include first transmission holes TH1 and first contact holes CH1_1. The first transmission holes TH1 overlap the first light emitting parts EA1 of the first pixels PX1, and the first light control holes CH1_1 overlap the light sensing parts RA.

The first transmission holes TH1 may respectively overlap the first to fourth sub-light emitting parts EA1a, EA1b, EA1c, and EA1d of the first light emitting part EA1 in the third direction Z. The first transmission holes TH1 may transmit light emitted from the first to fourth sub-light emitting parts EA1a, EA1b, EA1c, and EA1d to an upper surface of the window WDL (see FIG. 13).

An end of the first transmission hole TH1 may substantially coincide with an end of the first light emitting part EA1. In addition, an end of the first light blocking layer BM1 partitioning the first transmission hole TH1 may substantially coincide with the end of the first light emitting part EA1. For example, the end of the first light blocking layer BM1 might not be disposed inside or outside the first light emitting part EA1. In addition, the first light blocking layer BM1 might not overlap the first light emitting parts EA1 in the third direction Z, and may be disposed to surround the first light emitting parts EA1.

The first light blocking layer BM1 may be disposed on portions of upper surfaces that are adjacent to the first light emitting parts EA1 that are exposed by the first transmission holes TH1. For example, the first light blocking layer BM1 may overlap the pixel defining layer 160 and might not overlap the first light emitting parts EA1 (see FIG. 13). It has been illustrated in FIG. 7 that the first light blocking layer BM1 is disposed in a cross shape between the first light emitting parts EA1 (e.g., first sub-light emitting parts EA1a), but the present invention is not limited thereto. Accordingly, an area of one first light emitting part EA1 may be smaller than the sum of areas of the first transmission holes TH1 overlapping one first light emitting part EA1.

The first light control holes CH1_1 may overlap the light sensing parts RA in the third direction Z, respectively. The first light control holes CH1_1 may transmit light reflected from the window WDL toward the light sensing parts RA.

An area of the first light control hole CH1_1 may be greater than an area of the light sensing part RA. The light sensing part RA may overlap the first light control hole CH1_1. For example, the first light control hole CH1_1 may completely overlap the light sensing part RA. In addition, a portion of the first light control hole CH1_1 may overlap the light sensing part RA, and the remaining portion of the first light control hole CH1_1 may overlap the peripheral part NEA. An end of the first light blocking layer BM1 partitioning the first light control hole CH1_1 may be disposed outside the light sensing part RA. The first light blocking layer BM1 might not overlap the light sensing part RA in the third direction Z.

The first light blocking layer BM1 may be disposed in an island pattern so as to correspond to areas in which the first light emitting parts EA1 and the light sensing parts RA of the first pixels PX1 are disposed. For example, the first light blocking layer BM1 may be disposed in a rhombic shape, but present invention is not limited thereto.

The first light blocking layer BM1 might not overlap the second light emitting parts EA2 of the second pixels PX2 and the peripheral parts NEA adjacent to the second light emitting parts EA2 in the third direction Z. Accordingly, areas in which the second light emitting parts EA2 and the peripheral parts NEA adjacent to the second light emitting parts EA2 are disposed may be transmissive areas through which light emitted from the second light emitting parts EA2 is transmitted. The first to fourth sub-light emitting parts EA2a, EA2b, EA2c, and EA2d of the second light emitting part EA2 may be spaced apart from the first light blocking layer BM1 in a plan view.

A minimum distance L1 between the second light emitting part EA2 and the first light blocking layer BM1 may be greater than a minimum distance between the first light emitting part EA1 and the first light blocking layer BM1. A distance between the first light emitting part EA1 and the first light blocking layer BM1 may be substantially close to 0.

In the display device 1_1 according to the present embodiment, the end of the first light blocking layer BM1 is disposed outside the light sensing part RA, and thus, the first lateral light Ls1, that is, the noise light, incident on the light sensing part RA may be decreased. When the end of the first light blocking layer BM1 is disposed outside the light sensing part RA, the light emitted from the first light emitting part EA1 of the first pixel PX1 according to the private mode may function as a light source of the light sensing part RA, but the present invention is not limited thereto. The light emitted from the second light emitting part EA2 of the second pixel PX2 according to the normal mode may function as the noise light, which is the second lateral light Ls2 of the light sensing part RA. This will be described in detail with reference to cross-sectional views of FIGS. 13 and 14.

Figure 8:
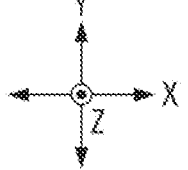
FIG. 8 is a plan layout view of FIG. 6 and a first light blocking layer according to an embodiment of the present invention.

FIG. 8 is a plan layout view of FIG. 6 and a first light blocking layer according to an embodiment of the present invention.

Referring to FIG. 8, a first light blocking layer BM1 of a display device 1_2 is different from the first light blocking layer BM1 of the display device 1-1 according to the previous embodiment including the first light control holes CH1_1 in that it includes first light control hole CH1_2 completely overlapping the light sensing parts RA in the third direction Z.

The first light control hole CH1_2 may completely overlap the light sensing part RA in the third direction Z. An area of the first light control hole CH1_2 may be substantially the same as an area of the light sensing part RA. Accordingly, an end of the first light control hole CH1_2 may coincide with an end of the light sensing part RA. An end of the first light blocking layer BM1 partitioning the first light control hole CH1_2 may coincide with the end of the light sensing part RA. For example, the end of the first light blocking layer BM1 might not be disposed inside or outside the light sensing part RA. The first light blocking layer BM1 might not overlap the light sensing part RA in the third direction Z, and may be disposed to surround the light sensing part RA.

The display device 1_2 according to the present embodiment includes the first light blocking layer BM1 having the end coinciding with the end of the light sensing part RA, and thus, the second lateral light Ls2, that is, the noise light, incident on the light sensing part RA may be decreased. Accordingly, the light emitted from the first light emitting part EA1 of the first pixel PX1 and the second light emitting part EA2 of the second pixel PX2 according to the private mode or the normal mode may function as a light source of the light sensing part RA. This will be described in detail with reference to cross-sectional views of FIGS. 15 and 16.

Figure 9:
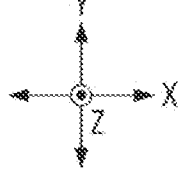
FIG. 9 is a plan layout view of FIG. 6 and a second light blocking layer according to an embodiment of the present invention.

FIG. 9 is a plan layout view of FIG. 6 and a second light blocking layer according to an embodiment of the present invention.

Referring to FIG. 9, the display device 1 may further include a second light blocking layer BM2 disposed on the first light blocking layer BM1.

The second light blocking layer BM2 may be disposed to overlap the peripheral parts NEA adjacent to the first light emitting parts EA1 and the light sensing parts RA of the first pixels PX1 in the third direction Z. The second light blocking layer BM2 might not overlap the peripheral parts NEA adjacent to the second light emitting parts EA2 of the second pixels PX2 in the third direction Z. The second light blocking layer BM2 may be disposed around the first light emitting parts EA1 to limit a viewing angle of light emitted from the first light emitting parts EA1, and may be disposed around the light sensing parts RA to limit an area of light incident on the light sensing parts RA.

The second light blocking layer BM2 may include second transmission holes TH2, which overlap the first light emitting parts EA1 of the first pixels PX1, and second light control holes CH2, which overlap the light sensing parts RA.

The second transmission holes TH2 may respectively overlap the first to fourth sub-light emitting parts EA1a, EA1b, EA1c, and EA1d of the first light emitting part EA1 in the third direction Z. The second transmission holes TH2 may transmit light emitted from the first to fourth sub-light emitting parts EA1a, EA1b, EA1c, and EA1d to the upper surface of the window WDL (see FIG. 13).

Each of the second transmission holes TH2 may completely overlap each of the first transmission holes TH1 in the third direction Z. For example, an end of the second transmission hole TH2 and the end of the first transmission hole TH1 may substantially coincide with the end of the first light emitting part EA1.

The second light blocking layer BM2 may be disposed on portions of upper surfaces that are adjacent to the first light emitting parts EA1 that are exposed by the second transmission holes TH2. For example, the second light blocking layer BM2 may overlap the pixel defining layer 160 and might not overlap the first light emitting parts EA1 (see FIG. 13). It has been illustrated in FIG. 9 that the second light blocking layer BM2 is disposed in a cross shape on the first light emitting parts EA1, but the present invention is not limited thereto. Accordingly, an area of one first light emitting part EA1 may be smaller than the sum of areas of the second transmission holes TH2 overlapping one first light emitting part EA1.

The second light control holes CH2 may overlap the light sensing parts RA in the third direction Z, respectively. The second light control holes CH2 may transmit light reflected from the window WDL toward the light sensing parts RA.

An area of the second light control hole CH2 may be smaller than the area of the light sensing part RA. The second light control hole CH2 may completely overlap the light sensing part RA. In addition, a portion of the light sensing part RA may overlap the second light control hole CH2, and the remaining portion of the light sensing part RA may overlap the second light blocking layer BM2. An end of the second light blocking layer BM2 partitioning the second light control hole CH2 may be disposed inside the light sensing part RA. For example, the second light blocking layer BM2 may overlap the light sensing part RA in the third direction Z.

The second light blocking layer BM2 may be disposed in an island pattern so as to correspond to areas in which the first light emitting parts EA1 and the light sensing parts RA of the first pixels PX1 are disposed, similar to the first light blocking layer BM1. For example, the second light blocking layer BM2 may be disposed in a rhombic shape, but present invention is not limited thereto.

The second light blocking layer BM2 might not overlap the second light emitting parts EA2 of the second pixels PX2 and the peripheral parts NEA adjacent to the second light emitting parts EA2 in the third direction Z. Accordingly, areas in which the second light emitting parts EA2 and the peripheral parts NEA adjacent to the second light emitting parts EA2 are disposed may be transmissive areas through which light emitted from the second light emitting parts EA2 is transmitted. The first to fourth sub-light emitting parts EA2a, EA2b, EA2c, and EA2d of the second light emitting part EA2 may be spaced apart from the second light blocking layer BM2 in a plan view. The end of the second light blocking layer BM2 may be disposed outside the first to fourth sub-light emitting parts EA2a, EA2b, EA2c, and EA2d.

A minimum distance L2 between the second light emitting part EA2 and the second light blocking layer BM2 may be greater than a minimum distance between the first light emitting part EA1 and the second light blocking layer BM2. A distance between the first light emitting part EA1 and the second light blocking layer BM2 may be substantially 0.

The display device 1 according to the present embodiment includes the second light blocking layer BM2 partially overlapping the light sensing part RA, such that an area of light incident on the light sensing part RA may be controlled. Accordingly, the photo-sensor PS may identify a fingerprint F pattern having a high resolution.

Figure 10:
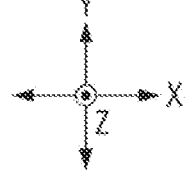
FIGS. 10 and 11 are plan views of the pixels and the photo-sensors according to the normal mode or the private mode.
Figure 11:
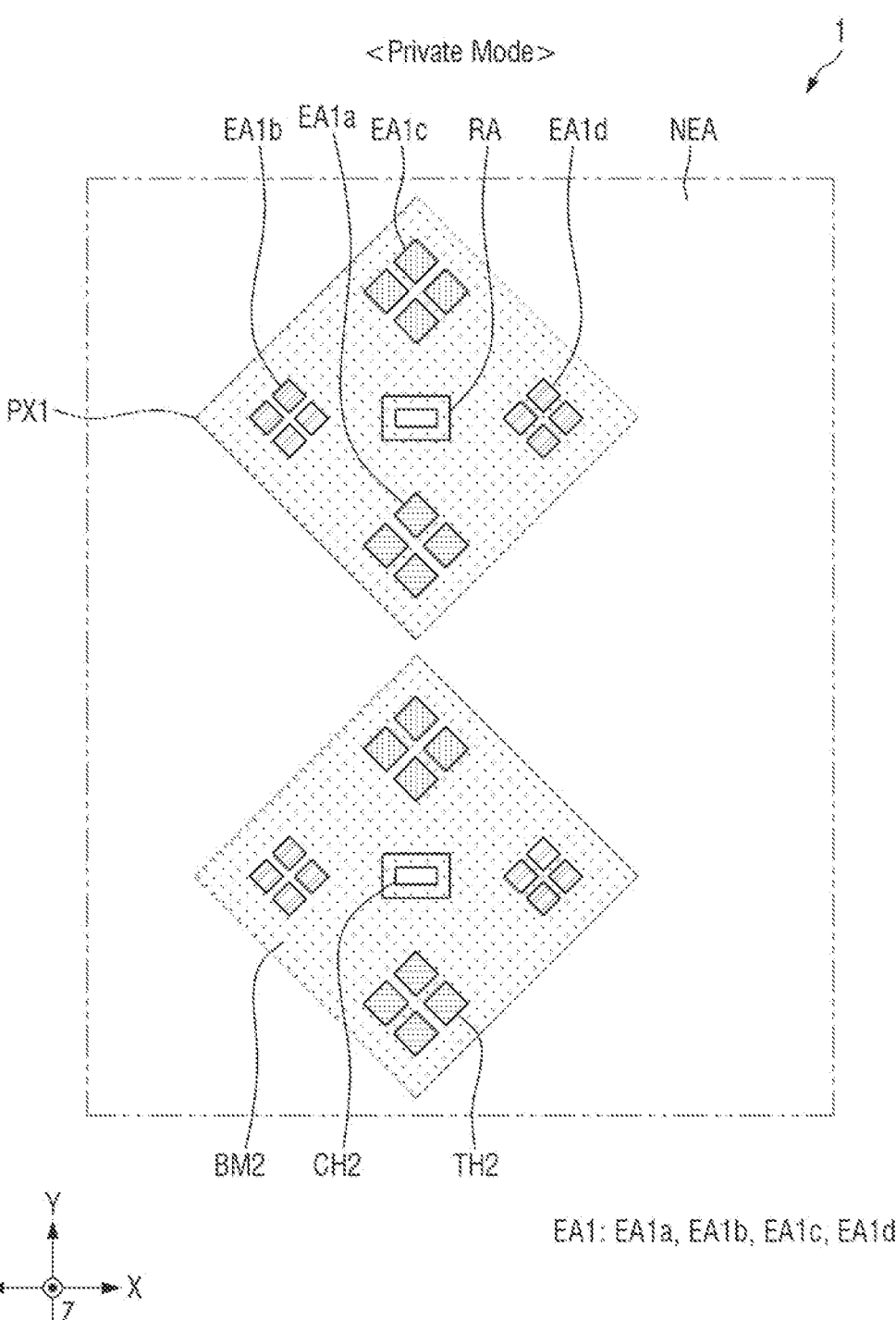
Figure 12:
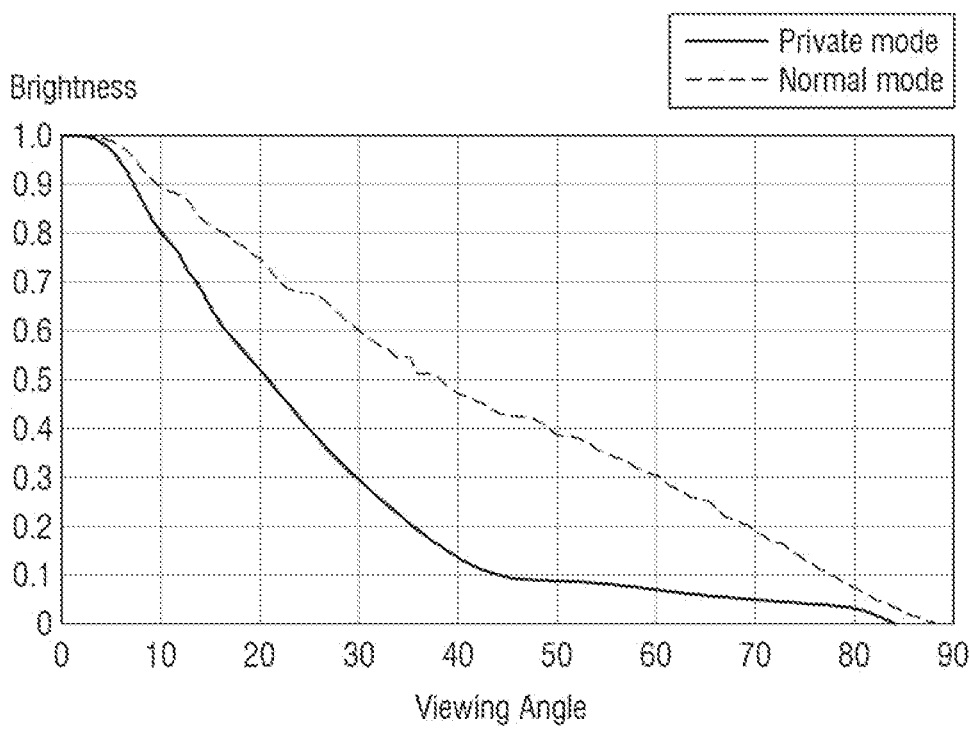
FIG. 12 is a graph illustrating a relationship between a viewing angle and an image brightness according to the normal mode or the private mode.

FIGS. 10 and 11 are plan views of the pixels and the photo-sensors according to the normal mode or the private mode. FIG. 12 is a graph illustrating a relationship between a viewing angle and an image brightness according to the normal mode or the private mode.

Referring to FIG. 10, according to the normal mode, the first light emitting parts EA1 of the first pixels PX1 and the second light emitting parts EA2 of the second pixels PX2 of the display device 1 may emit predetermined light. Accordingly, the first pixels PX1 and the second pixels PX2 may display an image having a general viewing angle.

Referring to FIG. 11, according to the private mode, the first light emitting parts EA1 of the first pixels PX1 of the display device 1 may emit predetermined light. In addition, the second light emitting parts EA2 of the second pixels PX2 might not emit predetermined light. Accordingly, an image having a viewing angle of the first pixel PX1 may be displayed.

Referring to FIG. 12, an X axis indicates a viewing angle, and a Y axis indicates an image brightness. In the normal mode and the private mode, when the viewing angle is 0°, the image brightness has a maximum value, and when the viewing angle is 90°, the image brightness has a minimum value. In addition, when the display device 1 is operated in the normal mode according to FIG. 10, as the viewing angle of the light of the display device 1 increases, the image brightness may decrease with a linear inclination.

In addition, when the display device 1 is operated in the private mode according to FIG. 11, as the viewing angle of the light of the display device 1 increases, the image brightness may decrease exponentially. For example, light having a viewing angle of about 40° or more may function as a light source for displaying an image in the normal mode, but might not function as a light source for displaying an image in the private mode. Accordingly, in the private mode, light having a viewing angle of about 0° to about 40° may be utilized as a light source for displaying an image, and thus, an image, of which lateral visibility may be decreased, may be displayed.

Figure 14:
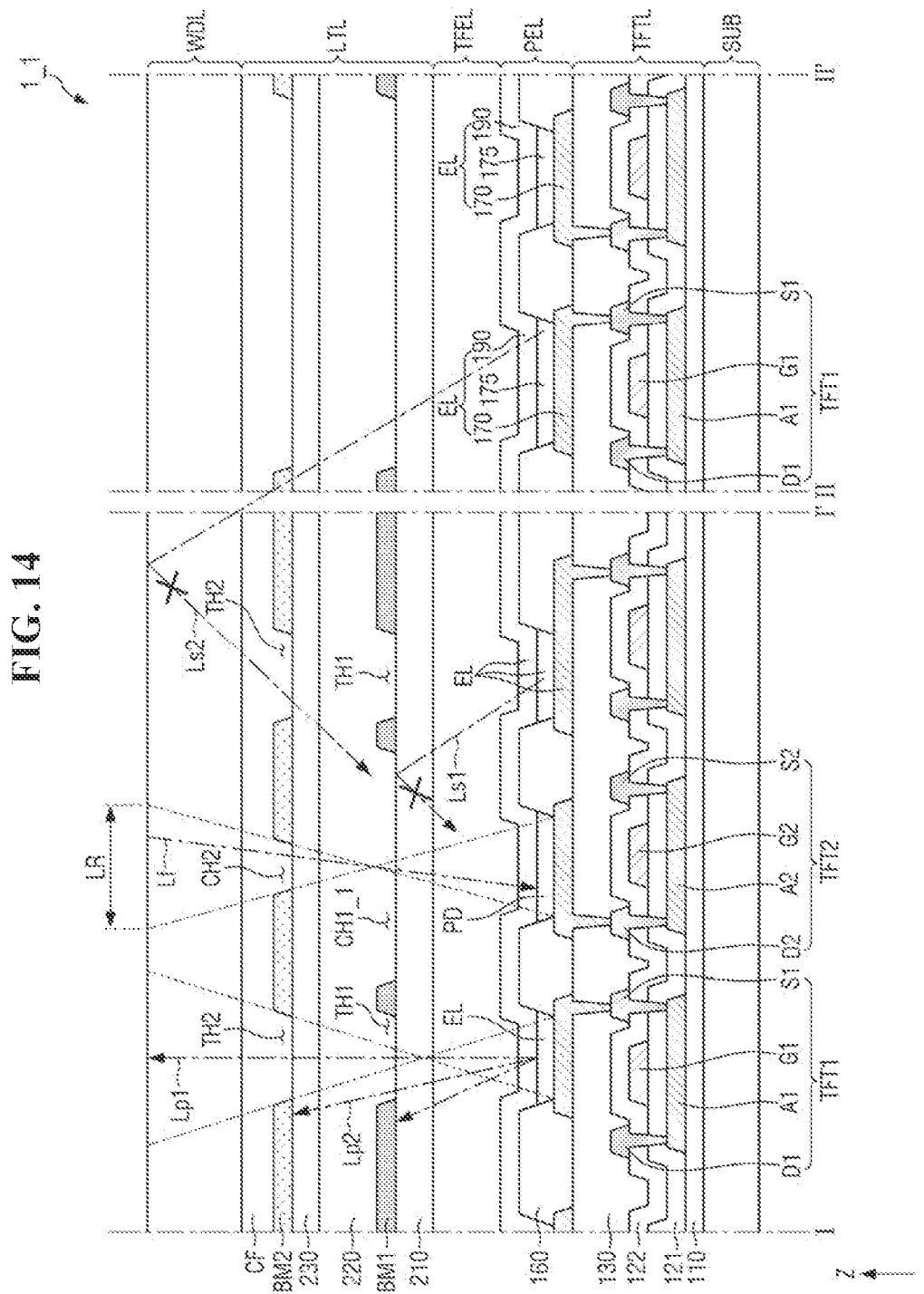
FIG. 14 is a cross-sectional view illustrating an incident direction of light in FIG. 13.

FIG. 13 is a cross-sectional view taken along line I-I' and line II-II' of FIGS. 7 and 9. FIG. 14 is a cross-sectional view illustrating an incident direction of light in FIG. 13.

The display device 1_1 may include a substrate SUB and a thin film transistor layer TFTL, a photoelectric element layer PEL, an encapsulation layer TFEL, a light transmission layer LTL, and a window WDL that are sequentially formed on the substrate SUB.

The substrate SUB may be a rigid substrate or be a flexible substrate that may be bent, folded, and rolled. The substrate SUB may be made of an insulating material such as glass, quartz, or a polymer resin.

A buffer layer 110 may be disposed on one surface of the substrate SUB. The buffer layer 110 may include, for example, silicon nitride, silicon oxide, silicon oxynitride, or the like.

The thin film transistor layer TFTL disposed on the buffer layer 110 may include a first thin film transistor TFT1 and a second thin film transistor TFT2. The first thin film transistor TFT1 may be the first transistor ST1 of FIG. 5. The second thin film transistor TFT2 may be the sensing transistor LT1 of FIG. 5.

A plurality of thin film transistors TFT1 and TFT2 may include, respectively, semiconductor layers A1 and A2, a gate insulating layer 121 disposed on portions of the semiconductor layers A1 and A2, gate electrodes G1 and G2 disposed on the gate insulating layer 121, an interlayer insulating layer 122 covering each of the semiconductor layers A1 and A2 and each of the gate electrodes G1 and G2, and source electrodes S1 and S2 and drain electrodes D1 and D2 disposed on the interlayer insulating layer 122.

The semiconductor layers A1 and A2 may form channels of the first thin film transistor TFT1 and the second thin film transistor TFT2, respectively. The semiconductor layers A1 and A2 may include polycrystalline silicon. In an embodiment of the present invention, the semiconductor layers A1 and A2 may include single crystal silicon, low-temperature polycrystalline silicon, amorphous silicon, or an oxide semiconductor. The oxide semiconductor may include, for example, a binary compound ($AB_x$), a ternary compound ($AB_xC_y$), or a quaternary compound ($AB_xC_yD_z$) containing indium, zinc, gallium, tin, titanium, aluminum, hafnium (Hf), zirconium (Zr), magnesium (Mg), and the like. The semiconductor layers A1 and A2 may include channel regions and source regions and drain regions doped with impurities, respectively.

The gate insulating layer 121 is disposed on the semiconductor layers A1 and A2. The gate insulating layer 121 electrically insulates a first gate electrode G1 and a first semiconductor layer A1 from each other, and electrically insulates a second gate electrode G2 and a second semiconductor layer A2 from each other. The gate insulating layer 121 may be made of an insulating material, for example, silicon oxide ($SiO_x$), silicon nitride ($SiN_x$), or metal oxide.

The first gate electrode G1 of the first thin film transistor TFT1 and the second gate electrode G2 of the second thin film transistor TFT2 are disposed on the gate insulating layer 121. The gate electrodes G1 and G2 may be formed to overlap the channel regions of the semiconductor layers A1 and A2, that is, on positions of the gate insulating layer 121 overlapping the channel regions, respectively.

The interlayer insulating layer 122 may be disposed on the gate electrodes G1 and G2. The interlayer insulating layer 122 may include an inorganic insulating material such as silicon oxide ($SiO_x$), silicon nitride ($SiN_x$), silicon oxynitride, hafnium oxide, or aluminum oxide. In addition, the interlayer insulating layer 122 may include a plurality of insulating layers, and may further include a conductive layer disposed between the insulating layers and forming a second capacitor electrode.

The source electrodes S1 and S2 and the drain electrodes D1 and D2 are disposed on the interlayer insulating layer 122. A first source electrode S1 of the first thin film transistor TFT1 may be electrically connected to the source region of the first semiconductor layer A1 through a contact hole penetrating through the interlayer insulating layer 122 and the gate insulating layer 121. A second source electrode S2 of the second thin film transistor TFT2 may be electrically connected to the source region of the second semiconductor layer A2 through a contact hole penetrating through the interlayer insulating layer 122 and the gate insulating layer 121. A first drain electrode D1 of the first thin film transistor TFT1 may be electrically connected to the drain region of the first semiconductor layer A1 through a contact hole penetrating through the interlayer insulating layer 122 and the gate insulating layer 121. A second drain electrode D2 of the second thin film transistor TFT2 may be electrically connected to the drain region of the second semiconductor layer A2 through a contact hole penetrating through the interlayer insulating layer 122 and the gate insulating layer 121. Each of the source electrodes S1 and S2 and the drain electrodes D1 and D2 may include one or more of, for example, aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

A planarization layer 130 may be formed on the interlayer insulating layer 122 to cover each of the source electrodes S1 and S2 and the drain electrodes D1 and D2. The planarization layer 130 may be made of an organic insulating material or the like. The planarization layer 130 may have a flat surface and include contact holes exposing any one of the source electrodes S1 and S2 and any one of the drain electrodes D1 and D2.

The photoelectric device layer PEL may be disposed on the planarization layer 130. The photoelectric device layer PEL may include light emitting elements EL, photoelectric conversion elements PD, and a pixel defining layer 160. The light emitting element EL may include a pixel electrode 170, an emission layer 175, and a common electrode 190, and the photoelectric conversion element PD may include a first electrode 180, a photoelectric conversion layer 185, and a common electrode 190. The light emitting elements EL and the photoelectric conversion elements PD may share the common electrode 190 with each other.

The pixel electrode 170 of the light emitting element EL may be disposed on the planarization layer 130. The pixel electrode 170 may be provided for each pixel PX. The pixel electrode 170 may be connected to the first source electrode S1 or the first drain electrode D1 of the first thin film transistor TFT1 through a contact hole penetrating through the planarization layer 130.

The pixel electrode 170 of the light emitting element EL may have a single-layer structure of, for example, molybdenum (Mo), titanium (Ti), copper (Cu), or aluminum (Al) or have a stacked layer structure, for example, a multilayer structure of, for example, ITO/Mg, ITO/MgF, ITO/Ag, or ITO/Ag/ITO including indium-tin-oxide (ITO), indium-zinc-oxide (IZO), zinc oxide (ZnO), or indium oxide $(In_2O_3)$, and silver (Ag), magnesium (Mg), aluminum (Al), platinum (Pt), lead (Pb), gold (Au), or nickel (Ni), but the present invention is not limited thereto.

In addition, the first electrode 180 of the photoelectric conversion element PD may be disposed on the planarization layer 130. The first electrode 180 may be provided for each photo-sensor PS. The first electrode 180 may be connected to the second source electrode S2 or the second drain electrode D2 of the second thin film transistor TFT2 through a contact hole penetrating through the planarization layer 130.

The first electrode 180 of the photoelectric conversion element PD may have a single-layer structure of, for example, molybdenum (Mo), titanium (Ti), copper (Cu), or aluminum (Al) or have a multilayer structure of ITO/Mg, ITO/MgF, ITO/Ag, or ITO/Ag/ITO, but the present invention is not limited thereto.

The pixel defining layer 160 may be disposed on the pixel electrode 170 and the first electrode 180. The pixel defining layer 160 may include openings overlapping the pixel electrodes 170 and exposing the pixel electrodes 170. An area in which the exposed pixel electrodes 170 and the emission layers 175 overlap each other may be a first light emitting part EA1 and a second light emitting part EA2 of each pixel PX.

In addition, the pixel defining layer 160 may include openings overlapping the first electrodes 180 and exposing the first electrodes 180. The openings exposing the first electrodes 180 may provide spaces in which the photoelectric conversion layers 185 of the respective photo-sensors PS are formed, and areas in which the exposed first electrodes 180 and the photoelectric conversion layers 185 overlap each other may be light sensing parts RA.

The pixel defining layer 160 may include an organic insulating material such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB). As another example, the pixel defining layer 160 may also include an inorganic material such as silicon nitride.

The emission layers 175 may be disposed on the pixel electrodes 170 of the light emitting elements EL exposed by the openings of the pixel defining layer 160. The emission layer 175 may include a high molecular material or a low molecular material, and may emit red, green, or blue light for each pixel PX. The light emitted from the emission layer 175 may contribute to image display or function as a light source incident on the photo-sensor PS.

When the emission layer 175 is formed of an organic material, a hole injecting layer (HIL) and a hole transporting layer (HTL) may be disposed at a lower portion of each emission layer 175, and an electron injecting layer (EIL) and an electron transporting layer (ETL) may be stacked at an upper portion of each emission layer 175. Each of these layers may be a single layer or multiple layers made of an organic material.

The photoelectric conversion layers 185 may be disposed on the first electrodes 180 of the photoelectric conversion elements PD exposed by the openings of the pixel defining layer 160. The photoelectric conversion layer 185 may generate photocharges in proportion to incident light. The incident light may be light emitted from the emission layer 175 and then reflected to enter the photoelectric conversion layer 185 or may be light provided from the outside regardless of the emission layer 175. Charges generated and accumulated in the photoelectric conversion layer 185 may be converted into electrical signals required for sensing.

The photoelectric conversion layer 185 may include an electron donating material and an electron accepting material. The electron donating material may generate donor ions in response to light, and the electron accepting material may generate acceptor ions in response to light. When the photoelectric conversion layer 185 is formed of an organic material, the electron donating material may include a compound such as subphthalocyanine (SubPc) or dibutylphosphate (DBP), but present invention is not limited thereto. The electron accepting material may include a compound such as fullerene, a fullerene derivative, or perylene diimide, but present invention is not limited thereto.

When the photoelectric conversion layer 185 is formed of the organic material, a hole injecting layer (HIL) and a hole transporting layer (HTL) may be disposed at a lower portion of each photoelectric conversion layer 185, and an electron injecting layer (EIL) and an electron transporting layer (ETL) may be stacked at an upper portion of each photoelectric conversion layer 185. Each of these layers may be a single layer or multiple layers made of an organic material.

The common electrode 190 may be disposed on the emission layers 175, the photoelectric conversion layers 185, and the pixel defining layer 160. The common electrode 190 may be disposed throughout the plurality of pixels PX and the plurality of photo-sensors PS in a form in which it covers the emission layers 175, the photoelectric conversion layers 185, and the pixel defining layer 160. The common electrode 190 may include a material layer having a small work function, for example, Li, Ca, LiF/Ca, LiF/Al, Al, Mg, Ag, Pt, Pd, Ni, Au, Nd, Ir, Cr, BaF, Ba, or compounds or mixtures thereof (e.g., a mixture of Ag and Mg, etc.). In addition, the common electrode 190 may include transparent metal oxide, for example, indium-tin-oxide (ITO), indium-zinc-oxide (IZO), or zinc oxide (ZnO).

The encapsulation layer TFEL may be disposed on the photoelectric element layer PEL. The encapsulation layer TFEL may include at least one inorganic layer and at least organic layer to prevent oxygen or moisture from penetrating into each of the emission layer 175 and the photoelectric conversion layer 185 or to protect each of the emission layer 175 and the photoelectric conversion layer 185 from foreign materials such as dust. For example, the encapsulation layer TFEL may be formed in a structure in which a first inorganic layer, an organic layer, and a second inorganic layer are sequentially stacked on each other. The first inorganic layer and the second inorganic layer may be formed as multiple layers in which one or more inorganic layers of a silicon nitride layer, a silicon oxynitride layer, a silicon oxide layer, a titanium oxide layer, and an aluminum oxide layer are alternately stacked on each other. The organic layer may be an organic layer made of, for example, an acrylic resin, an epoxy resin, a phenolic resin, a polyamide resin, a polyimide resin, or the like.

A first transparent inorganic layer 210, a first light blocking layer BM1, a transparent organic layer 220, a second transparent inorganic layer 230, a second light blocking layer BM2, and a color filter CF of the light transmission layer LTL may be sequentially disposed on the encapsulation layer TFEL.

The first transparent inorganic layer 210 may include an inorganic insulating material transmitting light. The first transparent inorganic layer 210 may include, for example, a silicon nitride layer, a silicon oxynitride layer, a silicon oxide layer, a titanium oxide layer, an aluminum oxide layer, or the like.

The first light blocking layer BM1 disposed on the first transparent inorganic layer 210 may be made of a material blocking light emission from the light emitting element EL or light reception to the photoelectric conversion element PD. The first light blocking layer BM1 may include an organic light blocking material using a resin material or the like including a pigment (e.g., carbon black) or a dye. Accordingly, the first light blocking layer BM1 may prevent the occurrence of color mixing due to permeation of light between adjacent first light emitting parts EA1.

The first light blocking layer BM1 may include the first transmission holes TH1 overlapping the first light emitting parts EA1. For example, the first transmission hole TH1 may completely overlap the first light emitting part EA1 in the third direction Z. The first transmission hole TH1 might not overlap the pixel defining layer 160 in the third direction Z. An end of the first light blocking layer BM1 may overlap an end of the pixel defining layer 160 in the third direction Z.

The first light blocking layer BM1 may include the first light control holes CH1_1 overlapping the light sensing parts RA. A portion of the first light control hole CH1_1 may overlap the pixel defining layer 160 in the third direction Z. The first light blocking layer BM1 might not overlap the light sensing part RA in the third direction Z.

The transparent organic layer 220 disposed on the first light blocking layer BM1 may include an organic material transmitting light. The transparent organic layer 220 may be an organic layer made of, for example, an acrylic resin, an epoxy resin, a phenolic resin, a polyamide resin, a polyimide resin, or the like.

The second transparent inorganic layer 230 disposed on the transparent organic layer 220 may include an inorganic insulating material transmitting light. The second transparent inorganic layer 230 may protect the transparent organic layer 220 disposed therebelow. The second transparent inorganic layer 230 may include, for example, a silicon nitride layer, a silicon oxynitride layer, a silicon oxide layer, a titanium oxide layer, an aluminum oxide layer, or the like.

The second light blocking layer BM2 disposed on the second transparent inorganic layer 230 may be made of a material blocking light emission from the light emitting element EL or light reception to the photoelectric conversion element PD. The second light blocking layer BM2 may include an organic light blocking material using a resin material or the like including a pigment (e.g., carbon black) or a dye. Accordingly, the second light blocking layer BM2 may prevent the occurrence of color mixing due to permeation of light between adjacent first light emitting parts EA1. The second light blocking layer BM2 may be covered by the color filter CF.

The second light blocking layer BM2 may include the second transmission holes TH2 overlapping the first light emitting parts EA1. For example, the second transmission hole TH2 may completely overlap the first light emitting part EA1 in the third direction Z. The second transmission hole TH2 might not overlap the pixel defining layer 160 in the third direction Z. An end of the second light blocking layer BM2 may overlap an end of the pixel defining layer 160 in the third direction Z.

The second light blocking layer BM2 may include the second light control holes CH2 overlapping the light sensing parts RA. The second light control hole CH2 might not overlap the pixel defining layer 160 in the third direction Z. The second light blocking layer BM2 may overlap the light sensing part RA in the third direction Z.

The color filter CF is disposed on the second light blocking layer BM2. The color filter CF may selectively transmit, absorb, or block the light. The color filter CF may be made of a resin material including a dye, a pigment or the like.

In an embodiment of the present invention, a width of the first transmission hole TH1 in one direction may be the same as a width of the second transmission hole TH2 in one direction. The first transmission hole TH1, the second transmission hole TH2, and the first light emitting part EA1 may overlap each other in the third direction Z.

A width of the first light control hole CH1_1 in one direction may be greater than a width of the second light control hole CH2 in one direction. The first light control hole CH1_1, the second light control hole CH2, and the light sensing part RA may overlap each other in the third direction Z.

The first light blocking layer BM1 partitioning the first transmission hole TH1 and the second light blocking layer BM2 partitioning the second transmission hole TH2 may be disposed to surround the first light emitting part EA1. Accordingly, the end of the pixel defining layer 160 partitioning the first light emitting part EA1 may overlap the end of the first light blocking layer BM1 and the end of the second light blocking layer BM2 in the third direction Z.

In addition, the first light blocking layer BM1 and the second light blocking layer BM2 might not overlap the second light emitting part EA2 in the third direction Z. In addition, the first light blocking layer BM1 and the second light blocking layer BM2 might not overlap the pixel defining layer 160 disposed between the second light emitting parts EA2, in the third direction Z.

The window WDL may be disposed on the color filter CF. The window WDL may be a protective member that may protect an upper surface of the display panel 10. The window WDL may include a rigid material such as glass or quartz. The window WDL may be adhered to the display panel 10 using an optical clear adhesive or the like.

Referring to FIG. 14, the display device 1_1 includes the light blocking layers BM1 and BM2 including a plurality of transmission holes TH1 and TH2, and may thus display images having different viewing angles according to desired modes. For example, a light Lp1 having a small viewing angle among lights emitted from the first light emitting part EA1 may reach the upper surface of the window WDL without being blocked by the light blocking layers BM1 and BM2. In addition, a light Lp2 having a great viewing angle among the lights emitted from the first light emitting part EA1 may be blocked by the first light blocking layer BM1 or the second light blocking layer BM2.

Accordingly, according to the private mode, the first light emitting part EA1 may display an image of which lateral visibility may be decreased.

In addition, the display device 1_1 includes the light blocking layers BM1 and BM2 including a plurality of light control holes CH1_1 and CH2, such that an area LR of the light incident on the light sensing part RA may be limited, and noise lights Ls1 and Ls2 may be minimized. For example, the first light control hole CH1_1 of the first light blocking layer BM1 overlaps the pixel defining layer 160, and thus, the first lateral light Ls1 reflected from the lower surface of the first light blocking layer BM1 among the lights emitted from the first light emitting part EA1 may be minimized. The first light blocking layer BM1 is preferably removed enough to not overlap the center of the pixel defining layer 160, but present invention is not limited thereto.

In addition, in the private mode other than the normal mode, the second light emitting part EA2 might not emit light. Accordingly, the second lateral light Ls2, which is emitted from the second light emitting part EA2 and is reflected from the upper surface of the window WDL but is transmitted in an area other than the area LR of the light and is incident on the light sensing part Ras, may be minimized.

Accordingly, according to the present embodiment, an amount of the noise light of the photo-sensor PS may be decreased, and the photo-sensor PS may identify a fingerprint F pattern with a high resolution.

Figure 15:
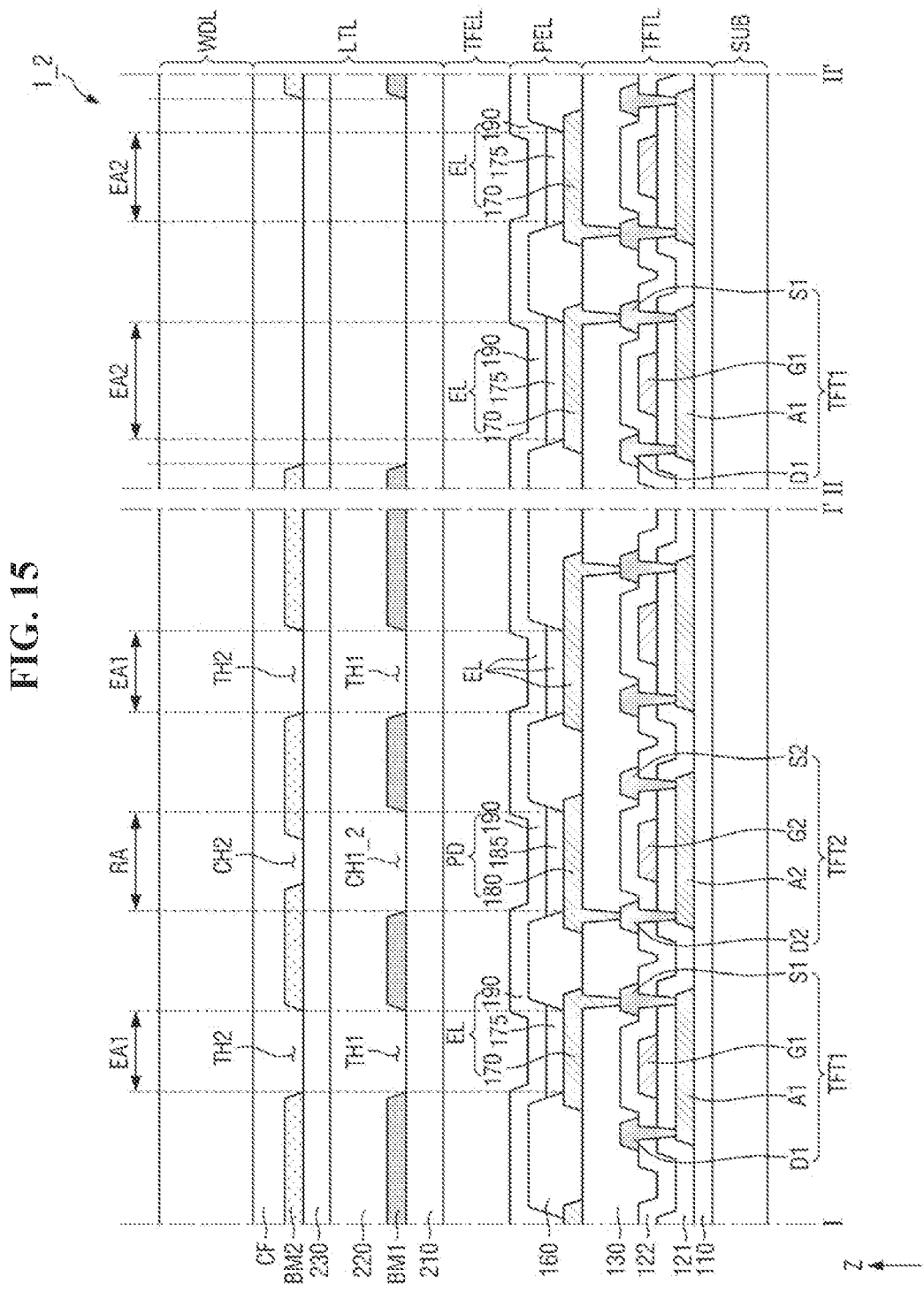
FIG. 15 is a cross-sectional view taken along line I-I' and line II-II' of FIGS. 8 and 9.
Figure 16:
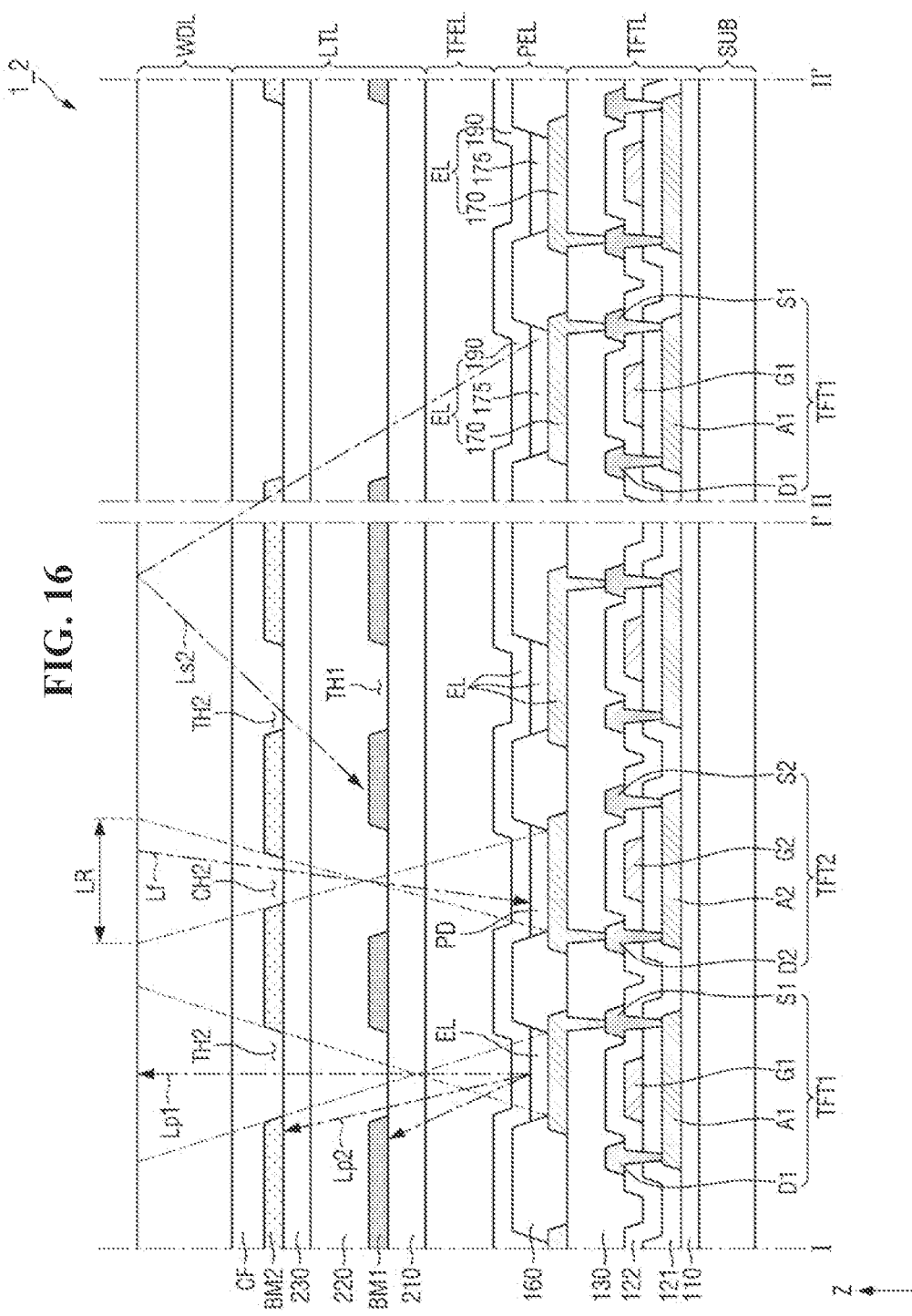
FIG. 16 is a cross-sectional view illustrating an incident direction of light in FIG. 15.

FIG. 15 is a cross-sectional view taken along line I-I' and line II-II' of FIGS. 8 and 9. FIG. 16 is a cross-sectional view illustrating an incident direction of light in FIG. 15.

The first light blocking layer BM1 of the display device 1_2 according to the present embodiment includes the first light control holes CH1_2 completely overlapping the light sensing parts RA in the third direction Z.

The first light blocking layer BM1 may include the first light control holes CH1_2 completely overlapping the light sensing parts RA. An end of the first light blocking layer BM1 may overlap an end of the pixel defining layer 160 partitioning the light sensing part RA, in the third direction Z.

A width of the first light control hole CH1_2 in one direction may be greater than a width of the second light control hole CH2 in one direction. The first light control hole CH1_1, the second light control hole CH2, and the light sensing part RA may overlap each other in the third direction Z.

Referring to FIG. 16, the display device 1_2 includes the light blocking layers BM1 and BM2 including a plurality of transmission holes TH1 and TH2, and may thus display an image of which lateral visibility is decreased according to the private mode.

In addition, the display device 1_2 includes the light blocking layers BM1 and BM2 including a plurality of light control holes CH1_1 and CH2, such that an area LR of the light incident on the light sensing part RA may be limited, and noise lights Ls1 and Ls2 may be minimized. Accordingly, the photo-sensor PS may identify a fingerprint F pattern with a high resolution.

Hereinafter, a display device 1' according to an embodiment of the present invention will be described.

Figure 17:
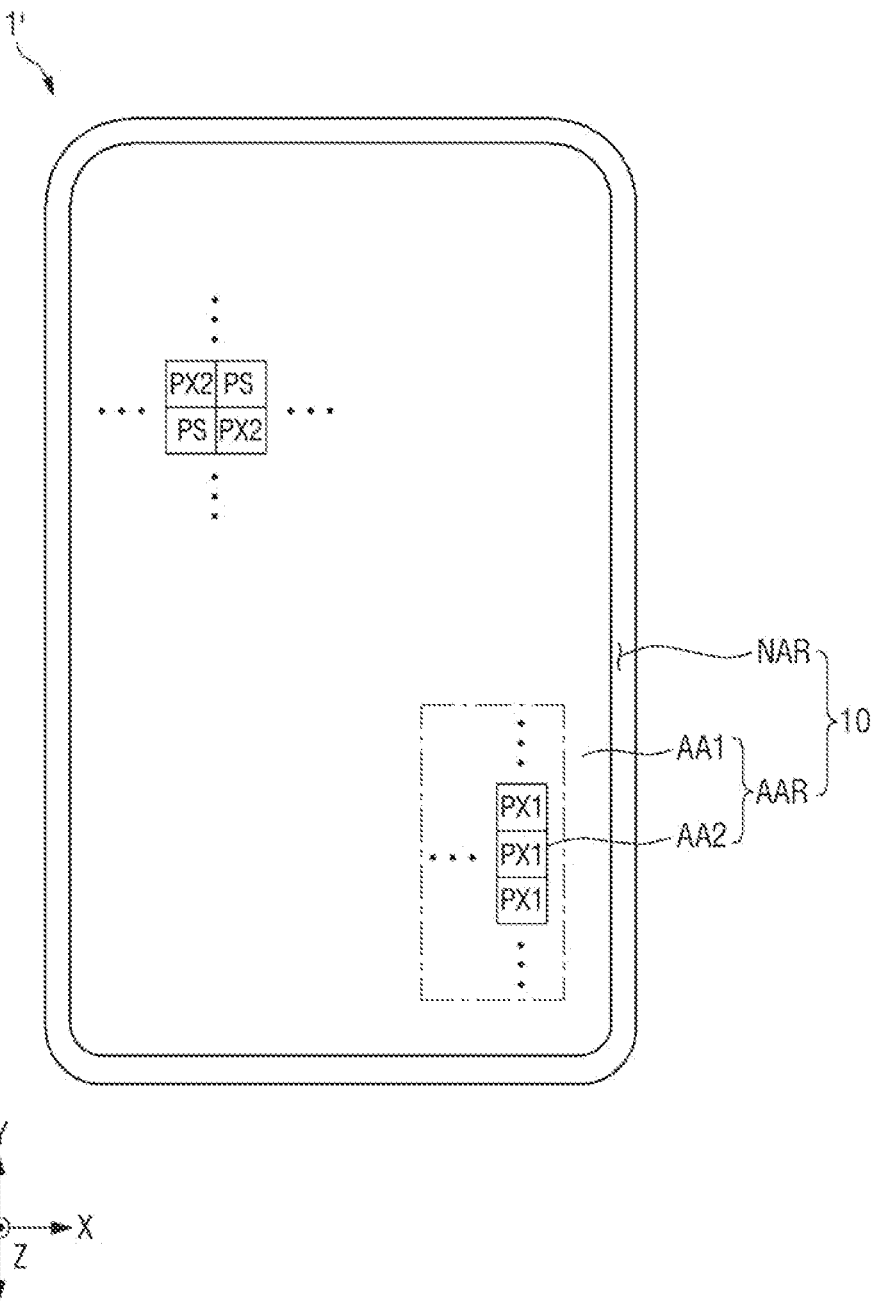
FIG. 17 is a plan view illustrating a display device according to an embodiment of the present invention.

FIG. 17 is a plan view illustrating a display device according to an embodiment of the present invention.

Referring to FIG. 17, the active area AAR includes a first area AA1 and a second area AA2. The first area AA1 includes second pixels PX2 defined as normal pixels and photo-sensors PS. The second area AA2 includes first pixels PX1 defined as private pixels. The first area AA1 may occupy most of the active area AAR, and the second area AA2 may be disposed at an outer side of the active area AAR adjacent to the first area AA1, but the present invention is not limited thereto. The first area AA1 and the second area AA2 may be spaced apart from each other, and the first pixel PX1 and the photo-sensor PS may be spaced apart from each other.

FIG. 18 is a plan layout view of pixels, photo-sensors, and a second light blocking layer of the display device according to an embodiment of the present invention.

According to an embodiment of the present invention, second light emitting parts EA2 and light sensing parts RA of the first area AA1 may be variously disposed along the first direction X and the second direction Y. First light emitting parts EA1 of the second area AA2 may be variously disposed along the first direction X and the second direction Y. The present embodiment is different from the previous embodiment in that a minimum distance between the second light emitting part EA2 and the light sensing part RA is smaller than a minimum distance between the first light emitting part EA1 and the light sensing part RA.

The present embodiment is the same as the previous embodiment in that the second light blocking layer BM2 surrounds the first light emitting part EA1 and overlaps a portion of the light sensing part RA. The first light emitting part EA1 may overlap the second transmission holes TH2 of the second light blocking layer BM2. The light sensing part RA may overlap the second light control hole CH2 of the second light blocking layer BM2. An area of the light sensing part RA is greater than an area of the second light control hole CH2. A width of the light sensing part RA in one direction is greater than a width of the second light control hole CH2 in one direction.

FIG. 19 is a cross-sectional view taken along line III-III' and line IV-IV' of FIG. 18.

In the present embodiment, the first light blocking layer BM1 includes a first light control hole CH1_3. The first light control hole CH1_3 overlaps the light sensing part RA and the second light control hole CH2 in the third direction Z. For example, the first light control hole CH1_3 completely overlaps the second light control hole CH2. A width of the first light control hole CH1_3 in one direction is the same as a width of the second light control hole CH2 in one direction. A portion of the first light blocking layer BM1 and a portion of the second light blocking layer BM2 overlap the light sensing part RA in the third direction Z.

According to the present embodiment, the light sensing part RA (or the photo-sensor PS) may be spaced apart from the first light emitting part EA1 (or the first pixel PX). Accordingly, both the first light emitting part EA1 and the second light emitting part EA2 may function as light sources of the photo-sensor PS according to the normal mode or the private mode. In addition, the second lateral light Ls2 emitted from the second light emitting part EA2 may be blocked by the first light blocking layer BM1 overlapping the light sensing part RA.

FIG. 20 is another cross-sectional view taken along line III-III' and line IV-IV' of FIG. 18.

In the present embodiment, the first light blocking layer BM1 includes a first light control hole CH1_4. The first light control hole CH1_4 overlaps the light sensing part RA and the second light control hole CH2 in the third direction Z. A width of the first light control hole CH1_4 in one direction may be greater than a width of the second light control hole CH2 in one direction. The first light blocking layer BM1 does not overlap the light sensing part RA in the third direction Z.

According to the present embodiment, the light sensing part RA (or the photo-sensor PS) may be apart from the first light emitting part EA1 (or the first pixel PX). In addition, the first light blocking layer BM1 includes the first light control hole CH1_4, and thus, the first light emitting part EA1 may function as a light source of the photo-sensor PS according to the private mode. According to the private mode, the second light emitting part EA2 might not function as a light source, and thus, the first lateral light Ls1 may be blocked.

While the present invention has been described with reference to the embodiments thereof, it will be understood by those of ordinary skill in the art that various changes in form and detail may be made thereto without departing from the spirit and scope of the present invention.

What is claimed is:

1. A display device comprising:
a substrate;
a first light emitting part and a second light emitting part disposed on the substrate and emitting light;
a light sensing part disposed on the substrate and sensing incident light;
a first light blocking layer disposed on the first light emitting part, the second light emitting part, and the light sensing part and having a first transmission hole; and
a second light blocking layer disposed on the first light blocking layer and having a second transmission hole,
wherein the first transmission hole, the second transmission hole, and the first light emitting part overlap each other in a direction substantially perpendicular to an upper surface of the substrate, and
wherein the second light blocking layer overlaps a portion of the light sensing part in the direction substantially perpendicular to the upper surface of the substrate.

2. The display device of claim 1, wherein a minimum distance between the second light emitting part and the second light blocking layer is greater than a minimum distance between the first light emitting part and the second light blocking layer.

3. The display device of claim 1, wherein an area of the first transmission hole is substantially the same as an area of the second transmission hole.

4. The display device of claim 1, wherein the first light blocking layer, which includes the first transmission hole, and the second light blocking layer, which includes the second transmission hole, surround the first light emitting part.

5. The display device of claim 1, wherein:
the first light blocking layer includes a first light control hole overlapping the light sensing part in the direction substantially perpendicular to the upper surface of the substrate, and
the second light blocking layer includes a second light control hole overlapping the light sensing part in the direction substantially perpendicular to the upper surface of the substrate.

6. The display device of claim 5, wherein a width of the first light control hole in one direction is greater than a width of the second light control hole in the one direction.

7. The display device of claim 6, wherein the first light blocking layer does not overlap the light sensing part in the direction substantially perpendicular to the upper surface of the substrate.

8. The display device of claim 6, wherein an area of the first light control hole is greater than an area of the light sensing part.

9. The display device of claim 6, further comprising: a pixel defining layer disposed on the substrate and partitioning the light sensing part,
wherein a portion of the first light blocking layer overlaps the pixel defining layer in the direction substantially perpendicular to the upper surface of the substrate.

10. The display device of claim 6, wherein an area of the first light control hole is substantially the same as an area of the light sensing part.

11. The display device of claim 6, wherein the first light control hole, the second light control bole, and the light sensing part overlap each other in the direction substantially perpendicular to the upper surface of the substrate.

12. The display device of claim 5, wherein a width of the first light control hole in one direction is substantially the same as a width of the second light control hole in the one direction.

13. The display device of claim 6, wherein a portion of the first light blocking layer and a portion of the second light blocking layer overlap the light sensing part in the direction substantially perpendicular to the upper surface of the substrate.

14. The display device of claim 1, wherein the substrate includes a first area, in which the second light emitting part and the light sensing part are disposed, and a second area, in which the first light emitting part is disposed, and
the first area and the second area are spaced apart from each other.

15. A display device comprising:
a substrate;
a first light emitting part disposed on the substrate and emitting light;
a light sensing part disposed on the substrate and sensing incident light;
a pixel defining layer partitioning the first light emitting part and the light sensing part from each other;
a first light blocking layer disposed on the first light emitting part, the light sensing part, and the pixel defining layer, and
a second light blocking layer disposed on the first light blocking layer,
wherein a portion of the second light blocking layer overlaps the light sensing part in a direction substantially perpendicular to an upper surface of the substrate, and
wherein each of the first and second light blocking layers is comprised of an organic light blocking material.

16. The display device of claim 15, further comprising:
a transparent organic layer disposed between the first light blocking layer and the second light blocking layer; and
a color filter disposed on the second light blocking layer.

17. The display device of claim 15, wherein an end of the pixel defining layer forming the first light emitting part overlaps an end of the first light blocking layer and an end of the second light blocking layer in the direction substantially perpendicular to the upper surface of the substrate.

18. The display device of claim 15, wherein:
the second light blocking layer includes a transmission hole overlapping the first light emitting part in the direction substantially perpendicular to the upper surface of the substrate, and
the second light blocking layer does not overlap the first light emitting part.

19. The display device of claim 15, wherein:

the first light blocking layer includes a first light control hole, the second light blocking layer includes a second light control hole, and a width of the first light control hole in one direction is different from a width of the second light control hole in the one direction.

20. An electronic device comprising:

a display device comprising:

a substrate;

a first light emitting part and a second light emitting part disposed on the substrate and emitting light;

a light sensing part disposed on the substrate and sensing incident light;

a first light blocking layer disposed on the first light emitting part, the second light emitting part, and the light sensing part and having a first transmission hole; and a second light blocking layer disposed on the first light blocking layer and having a second transmission hole, wherein the first transmission hole, the second transmission hole, and the first light emitting part overlap each other in a direction substantially perpendicular to an upper surface of the substrate, and wherein the second light blocking layer overlaps a portion of the light sensing part in the direction substantially perpendicular to the upper surface of the substrate.

* * * * *